United States Patent
Chern et al.

(10) Patent No.: US 9,524,934 B2
(45) Date of Patent: Dec. 20, 2016

(54) INTEGRATED CIRCUITS WITH ELECTRICAL FUSES AND METHODS OF FORMING THE SAME

(75) Inventors: Chan-Hong Chern, Palo Alto, CA (US); Fu-Lung Hsueh, Kaohsiung (TW); Kuoyuan (Peter) Hsu, San Jose, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 968 days.

(21) Appl. No.: 13/302,335

(22) Filed: Nov. 22, 2011

(65) Prior Publication Data

US 2013/0126979 A1    May 23, 2013

(51) Int. Cl.
| | |
|---|---|
| *H01L 21/8238* | (2006.01) |
| *H01L 23/525* | (2006.01) |
| *H01L 27/06* | (2006.01) |
| *H01L 29/51* | (2006.01) |
| *H01L 29/66* | (2006.01) |

(52) U.S. Cl.
CPC ....... *H01L 23/5256* (2013.01); *H01L 27/0617* (2013.01); *H01L 27/0629* (2013.01); *H01L 29/517* (2013.01); *H01L 29/66545* (2013.01); *H01L 2924/0002* (2013.01)

(58) Field of Classification Search
CPC ................ H01L 23/5256; H01L 27/112; H01L 27/11206; H01L 21/823842; H01L 27/115; H01L 27/13; H01L 21/823437; H01L 21/823857; H01L 21/8239; H01L 27/088; H01L 29/66606; H01L 21/823828; H01L 21/823835

USPC ......................................... 438/132, 215, 281
See application file for complete search history.

(56) References Cited

U.S. PATENT DOCUMENTS

| | | | | |
|---|---|---|---|---|
| 2010/0117710 | A1* | 5/2010 | Debnath et al. | ............... 327/336 |
| 2010/0237435 | A1* | 9/2010 | Chudzik | ........... H01L 21/82343 257/380 |
| 2011/0156161 | A1* | 6/2011 | Tseng | .................. H01L 23/5256 257/379 |
| 2011/0266633 | A1* | 11/2011 | Beyer et al. | ................... 257/379 |
| 2011/0272764 | A1* | 11/2011 | Kim | ............................... 257/368 |
| 2012/0129312 | A1* | 5/2012 | Utomo | ................ H01L 23/5256 438/381 |

FOREIGN PATENT DOCUMENTS

CN              101027770        8/2007

\* cited by examiner

*Primary Examiner* — Benjamin Sandvik
*Assistant Examiner* — Leslie Pilar Cruz
(74) *Attorney, Agent, or Firm* — Hauptman Ham, LLP

(57) ABSTRACT

A method of forming an integrated circuit includes forming at least one transistor over a substrate. Forming the at least one transistor includes forming a gate dielectric structure over a substrate. A work-function metallic layer is formed over the gate dielectric structure. A conductive layer is formed over the work-function metallic layer. A source/drain (S/D) region is formed adjacent to each sidewall of the gate dielectric structure. At least one electrical fuse is formed over the substrate. Forming the at least one electrical fuse includes forming a first semiconductor layer over the substrate. A first silicide layer is formed on the first semiconductor layer.

16 Claims, 30 Drawing Sheets

US 9,524,934 B2

INTEGRATED CIRCUITS WITH ELECTRICAL FUSES AND METHODS OF FORMING THE SAME

TECHNICAL FIELD

The present disclosure relates generally to the field of semiconductor devices and, more particularly, to integrated circuits with electrical fuses and methods of forming the same.

BACKGROUND

Various one-time programmable (OTP) devices have been provided and used in the semiconductor industry. The OTP devices can be, for example, mask read only memory (Mask ROM), electrical programmable ROM (EPROM), etc. An e-fuse OTP device uses a fuse element connected to a programming transistor. By selectively blowing fuses within an integrated circuit, which has multiple potential uses, a generic integrated circuit design may be economically manufactured and adapted to a variety of customer uses.

Electrical fuses are incorporated in the design of the integrated circuits, and are selectively blown, for example, by passing an electrical current of a sufficient magnitude to cause melting or agglomeration, thereby creating a more resistive path or an open circuit. The process of selectively blowing fuses is referred to as "programming."

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes. In fact, the numbers and dimensions of the various features may be arbitrarily increased or reduced for clarity of discussion.

DETAILED DESCRIPTION

Figure 1A:
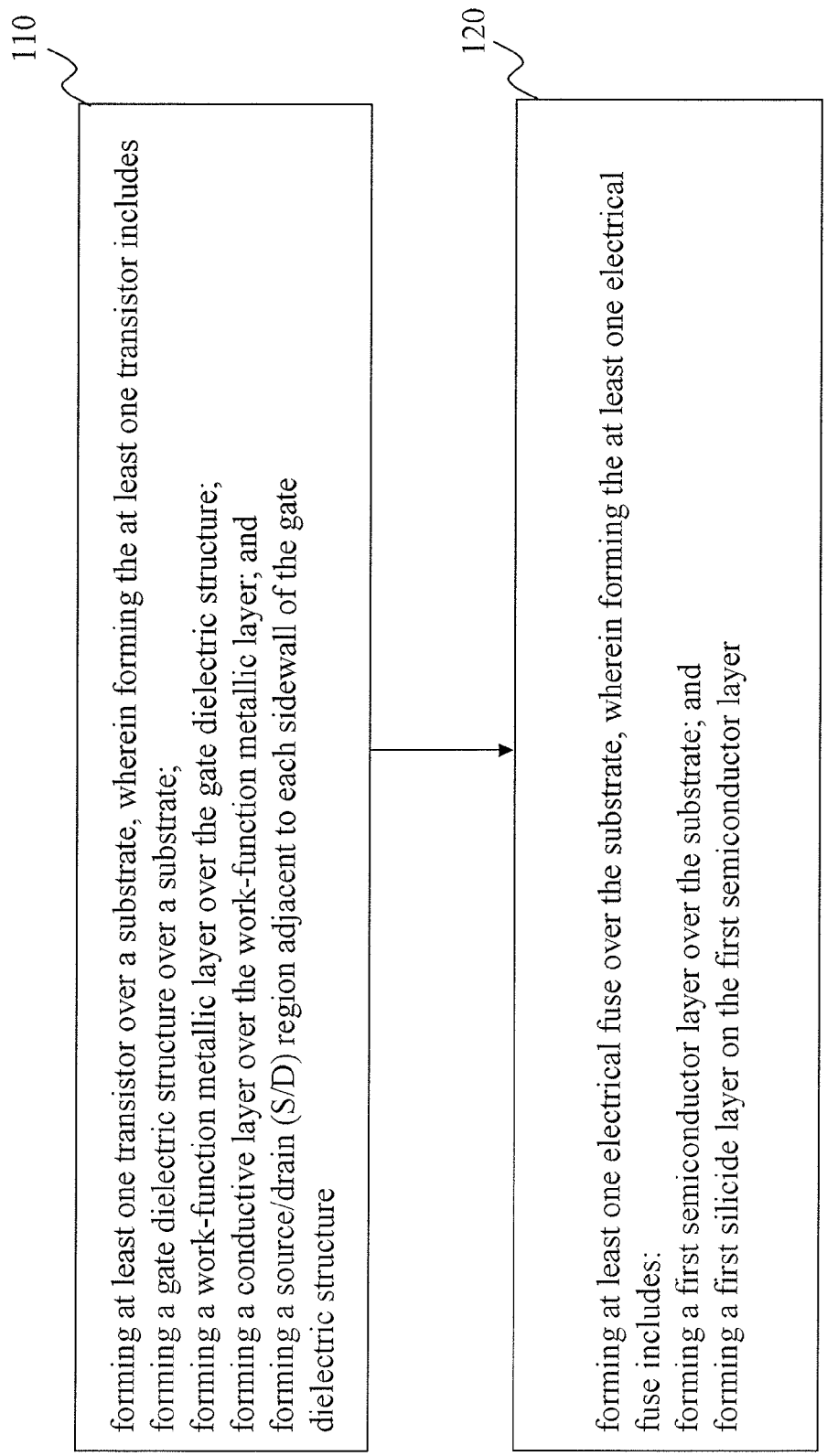
FIG. 1A is a flowchart of an exemplary method of forming an integrated circuit.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. During the scaling trend, various materials have been implemented for the gate electrode and gate dielectric for CMOS devices. For example, high-dielectric constant gate dielectric materials and metal gates (HK/MG) have been adopted to enhance electrical performances of CMOS devices.

During a gate-last HK/MG process, dummy polysilicon gate electrodes of CMOS devices and electrical fuses are replaced by metallic materials. The metallic materials of the CMOS devices are designed to minimize the electron migration (EM) concern during the electrical operation of the CMOS devices. Applicants found that the high EM reliability of the metallic materials make programming the electrical fuses difficult.

It is understood that the following descriptions provide many different embodiments, or examples, for implementing different features of the disclosure. Specific examples of components and arrangements are described below to simplify the present disclosure. These are, of course, examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

FIG. 1A is a flowchart of an exemplary method of forming an integrated circuit. The integrated circuit includes CMOS devices and at least one one-time programmable (OTP) device. In some embodiments, the integrated circuit may includes various passive and active microelectronic devices, such as resistors, capacitors, inductors, diodes, metal-oxide-semiconductor field effect transistors (MOSFET), complementary MOS (CMOS) transistors, bipolar junction transistors (BJTs), laterally diffused MOS (LDMOS) transistors, high power MOS transistors, FinFET transistors, or other types of transistors. In some embodiments, the integrated circuit includes a mixed-signal circuit, a radio frequency (RF) circuit, other high-speed circuits, or any combinations thereof.

Referring now to FIG. 1A, the method of forming an integrated circuit includes forming at least one transistor over a substrate (block 110). The block 110 includes forming a gate dielectric structure over a substrate; forming a work-function metallic layer over the gate dielectric structure; forming a conductive layer over the work-function metallic layer; and forming a source/drain (S/D) region adjacent to each sidewall of the gate dielectric structure. The method also includes forming at least one electrical fuse over the substrate (block 120). The block 120 includes forming a first semiconductor layer over the substrate and forming a first silicide layer on the first semiconductor layer.

It is understood that FIG. 1A has been simplified for a better understanding of the concepts of the present disclosure. Accordingly, it should be noted that additional processes may be provided before, during, and/or after the method of FIG. 1A, and that some other processes may be briefly described herein. It is also noted that though FIG. 1A shows the order of the blocks 110 and 120, the order shown in FIG. 1A is merely exemplary. In some embodiments, at least one process step is shared for forming portions of the transistor and the electrical fuse.

Figure 1B:
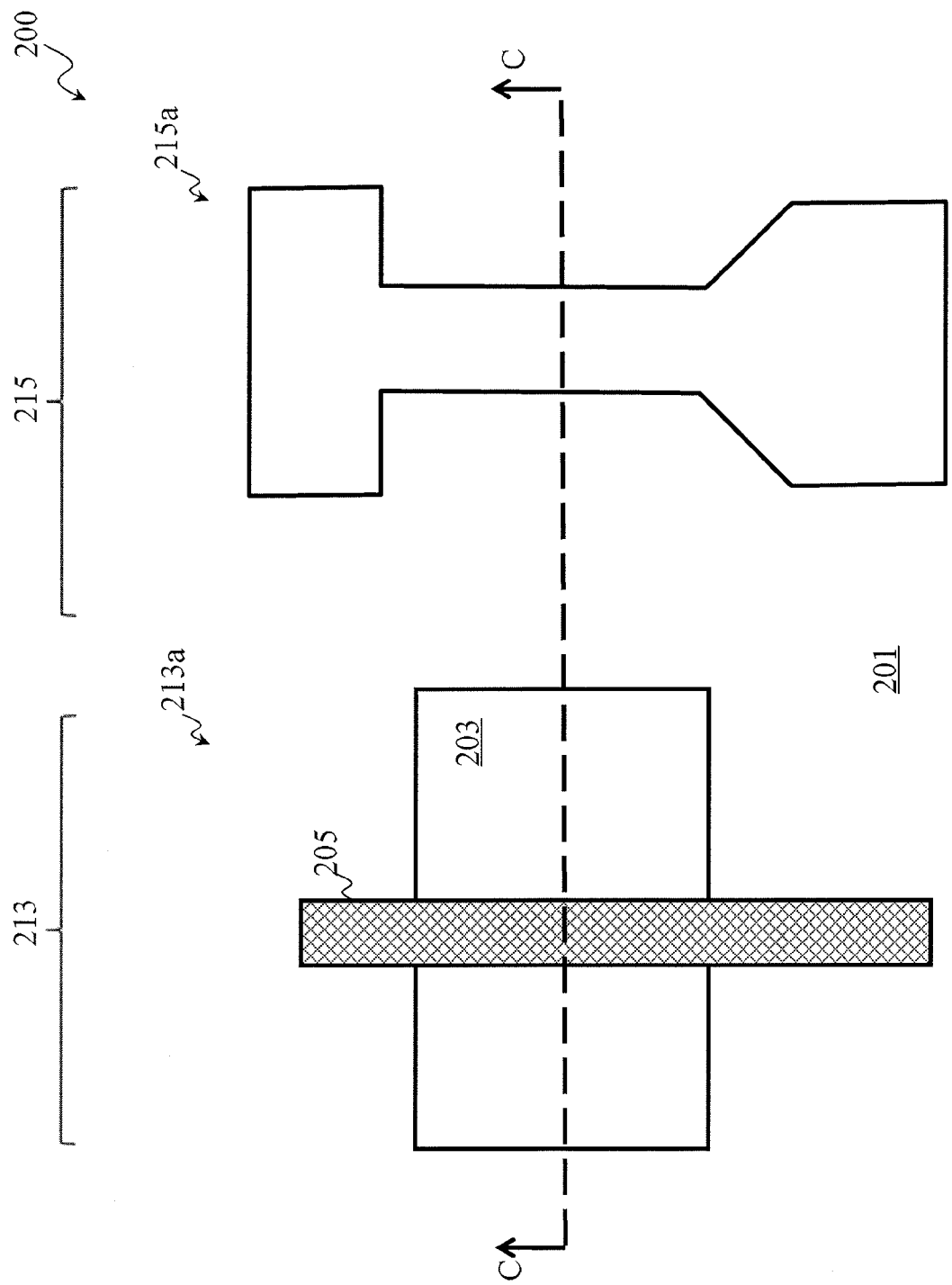
FIG. 1B is a schematic top view of an exemplary integrated circuit.

FIG. 1B is a schematic top view of an exemplary integrated circuit. In FIG. 1B, an integrated circuit 200 includes a transistor 213a disposed in a transistor region 213 and an electrical fuse 215a disposed in an electrical fuse region 215. The transistor 213a includes a gate electrode 205 that is disposed over an active area 203 of a substrate 201. The electrical fuse 215a is disposed over an isolation area (not labeled) that is disposed around the active area 203. For programming, the electrical fuse 215a is subjected to an electrical current to cause melting or agglomeration, thereby creating a more resistive path or an open circuit. It is noted that the layers indicating the active area 203 and the gate electrode 205 shown in FIG. 1B are merely exemplary. In some embodiments, the transistor 213a and the electrical fuse 215a include other layers, e.g., a contact layer, a metal routing layer, etc.

FIGS. 2A-2M are schematic cross-sectional views of an integrated circuit during various gate-last high-K metal gate fabrication stages taken along the section line C-C of FIG. 1B. It is understood that FIGS. 2A-2M have been simplified for a better understanding of the concepts of the present disclosure. Accordingly, it should be noted that additional processes may be provided before, during, and/or after FIGS. 2A-2M, and that some other processes may only be briefly described herein.

Referring now to FIGS. 2A-2M, the integrated circuit 200 is fabricated over the substrate 201. The substrate 201 can be a silicon substrate doped with a P-type dopant, such as boron (a P-type substrate). Alternatively, the substrate 201 could be another suitable semiconductor material. For example, the substrate 201 may be a silicon substrate that is doped with an N-type dopant, such as phosphorous or arsenic (an N-type substrate). The substrate 201 may alternatively be made of some other suitable elementary semiconductor, such as diamond or germanium; a suitable compound semiconductor, such as silicon carbide, silicon germanium, indium arsenide, or indium phosphide; or a suitable alloy semiconductor, such as silicon germanium carbide, gallium arsenic phosphide, or gallium indium phosphide. Further, the substrate 201 could include an epitaxial layer (epi layer), may be strained for performance enhancement, and may include a silicon-on-insulator (SOI) structure.

Figure 2A:
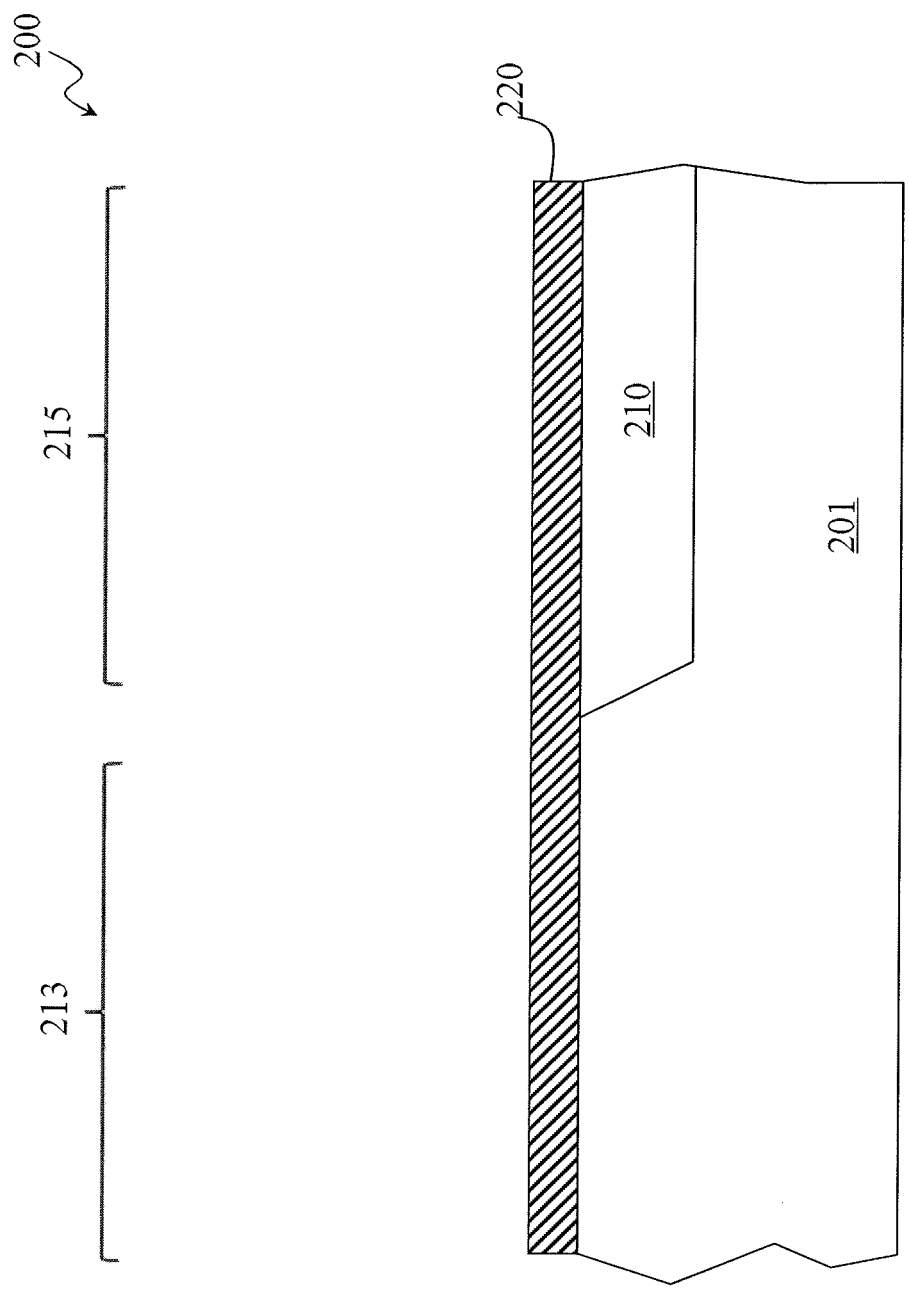
FIGS. 2A-2M are schematic cross-sectional views of an integrated circuit during various gate-last high-dielectric constant (high-K) metal gate fabrication stages.

Referring to FIG. 2A, an isolation structure, e.g., a shallow trench isolation (STI) feature 210, is formed in the substrate 201. In some embodiments, the STI feature 210 is formed by etching recesses (or trenches) in the substrate 201 and filling the recesses with a dielectric material. In some embodiments, the dielectric material of the STI feature 210 includes silicon oxide. In some alternative embodiments, the dielectric material of the STI feature 210 includes silicon nitride, silicon oxy-nitride, fluoride-doped silicate glass (FSG), a low dielectric constant (low-k) dielectric material, other dielectric materials, and/or any combinations thereof.

Referring again to FIG. 2A, a gate dielectric stack 220 is formed over the substrate 201. In some embodiments, the gate dielectric stack 220 includes at least one interfacial dielectric layer and/or at least one high dielectric constant (high-k) layer. The interfacial dielectric layer may include a material such as silicon oxide, silicon nitride, silicon oxynitride, other gate dielectric materials, and/or combinations thereof. The high-k dielectric layer can have a material having a dielectric constant that is greater than a dielectric constant of $SiO_2$, which is approximately 4. The high-k gate dielectric layer can have a thickness that is greater than the interfacial dielectric layer. In some embodiments, the high-k gate dielectric layer may include at least one of $Al_2O_3$, HfO, $HfO_2$, ZrO, $ZrO_2$, ZrSiO, YO, $Y_2O_3$, LaO, $La_2O_5$, GdO, $Gd_2O_5$, TiO, $TiO_2$, TiSiO, TaO, $Ta_2O_5$, TaSiO, HfErO, HfLaO, HfYO, HfGdO, HfAlO, HfZrO, HMO, HfTaO, HfSiO, SrTiO, ZrSiON, HfZrTiO, HfZrSiON, HfZrLaO, HfZrAlO, or any combinations thereof. In some embodiments, the interfacial dielectric layer and/or the high-k gate dielectric layer can be formed by, for example, a chemical vapor deposition (CVD) process, an atomic layer deposition (ALD) process, a thermal oxidation process, a furnace process, other deposition processes, or any combinations thereof.

Figure 2B:
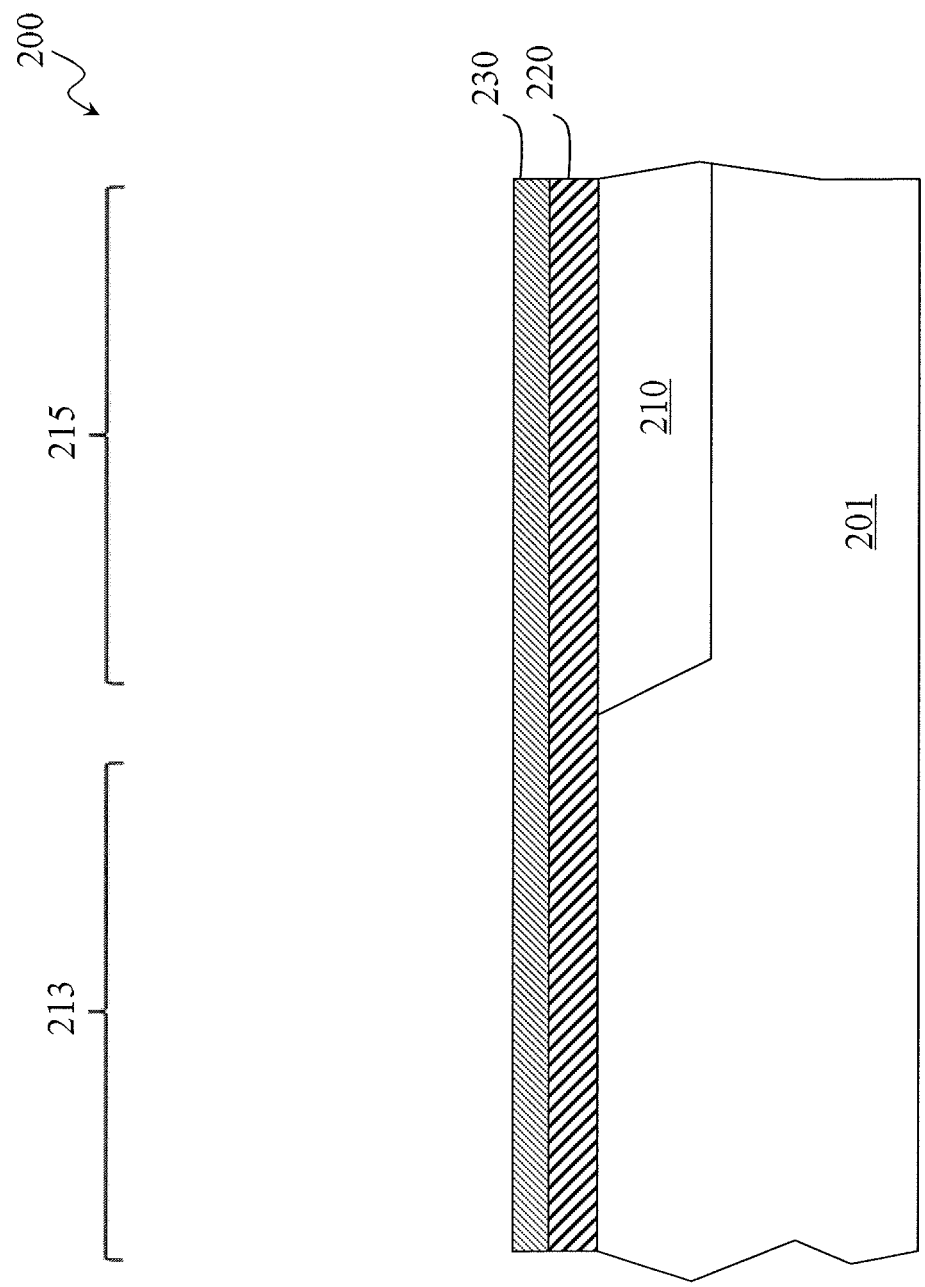

Referring to FIG. 2B, at least one diffusion barrier material 230 is optionally formed over the gate dielectric stack 220. The diffusion barrier material 230 is configured to prevent metallic ions of a work-function metal material 240 (described below in FIG. 2M) from diffusing into the gate dielectric stack 220. The diffusion barrier material 230 may comprise at least one material such as aluminum oxide, aluminum, aluminum nitride, titanium, titanium nitride (TiN), tantalum, tantalum nitride, other suitable material, and/or combinations thereof. In some embodiments, the diffusion barrier material 230 is formed, for example, by any suitable process, such as an ALD process, CVD process, a physical vapor deposition (PVD) process, an reduced-pressure CVD (RPCVD) process, a plasma-enhanced CVD (PECVD) process, a metal-organic CVD (MOCVD) process, a plating process, a sputtering process, or any combinations thereof.

Figure 2C:
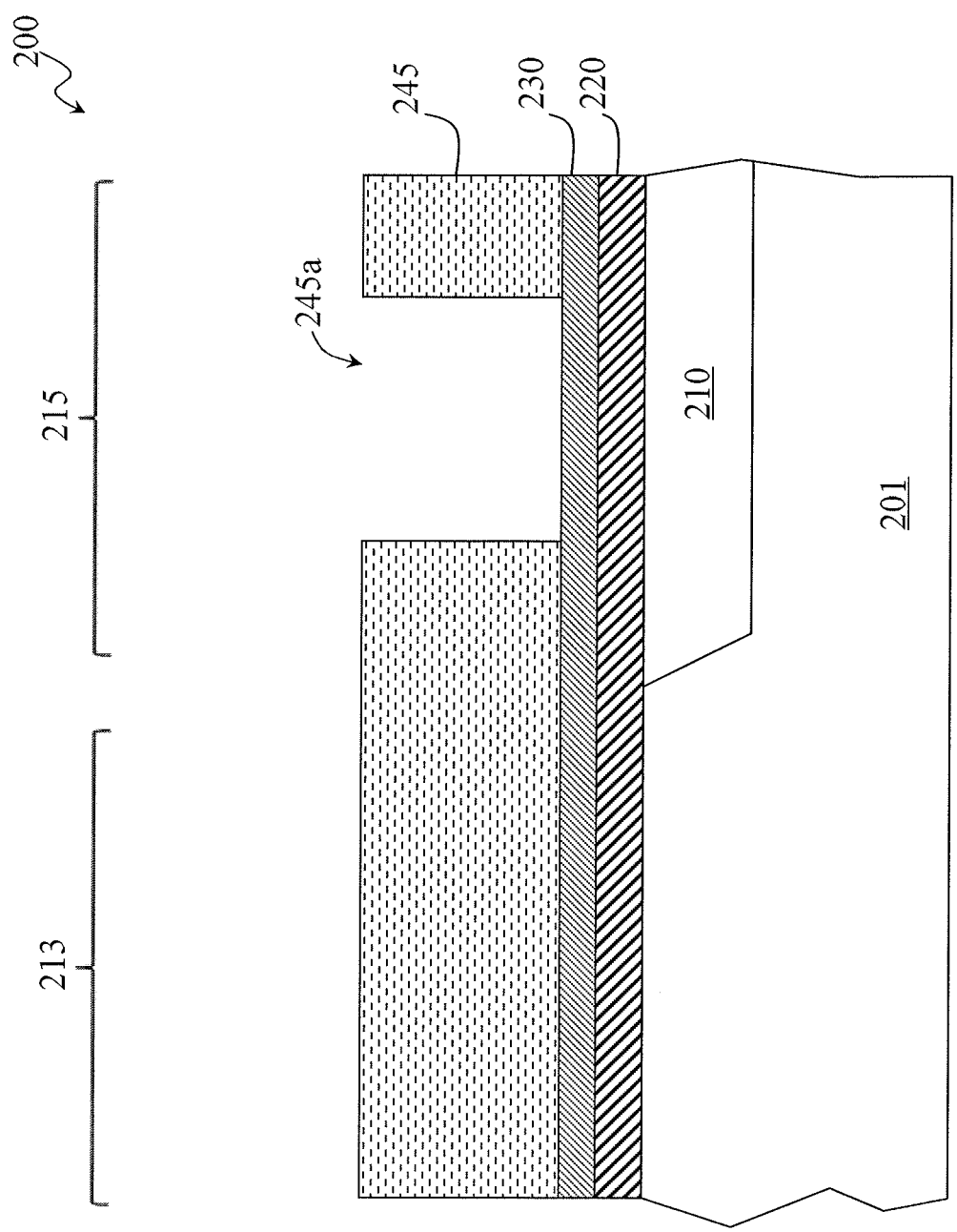

Referring to FIG. 2C, a mask layer 245 is optionally formed over the diffusion barrier material 230. The mask layer 245 covers the transistor region 213 and have an opening 245a exposing at least a portion of the diffusion barrier material 230 in the electrical fuse region 215. In some embodiments, the mask layer 245 can be made of, for example, a photoresist material and/or a dielectric material, e.g., silicon oxide, silicon oxynitride, silicon nitride, silicon carbide, other dielectric materials, or any combinations thereof.

Figure 2D:
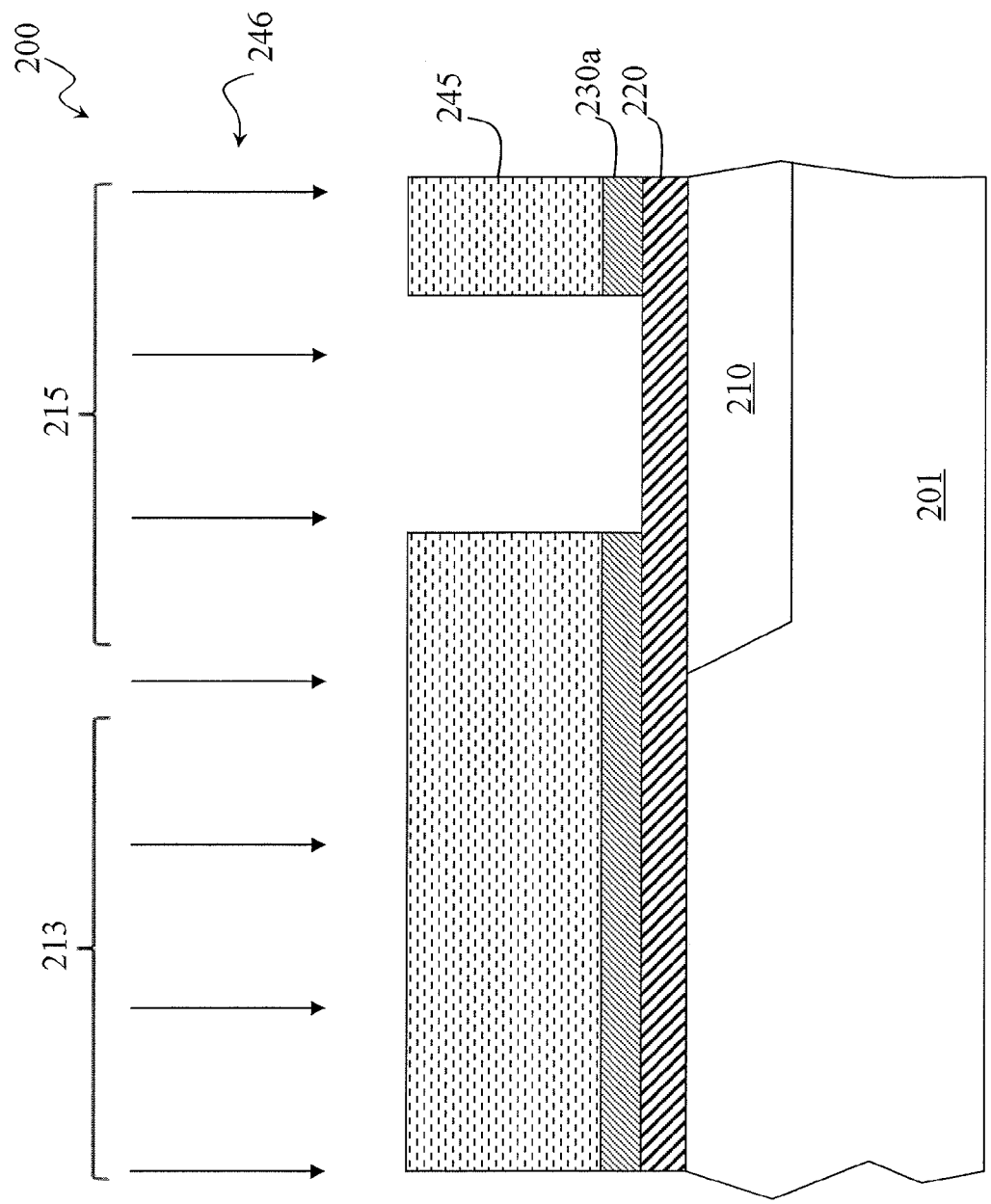
Figure 2E:
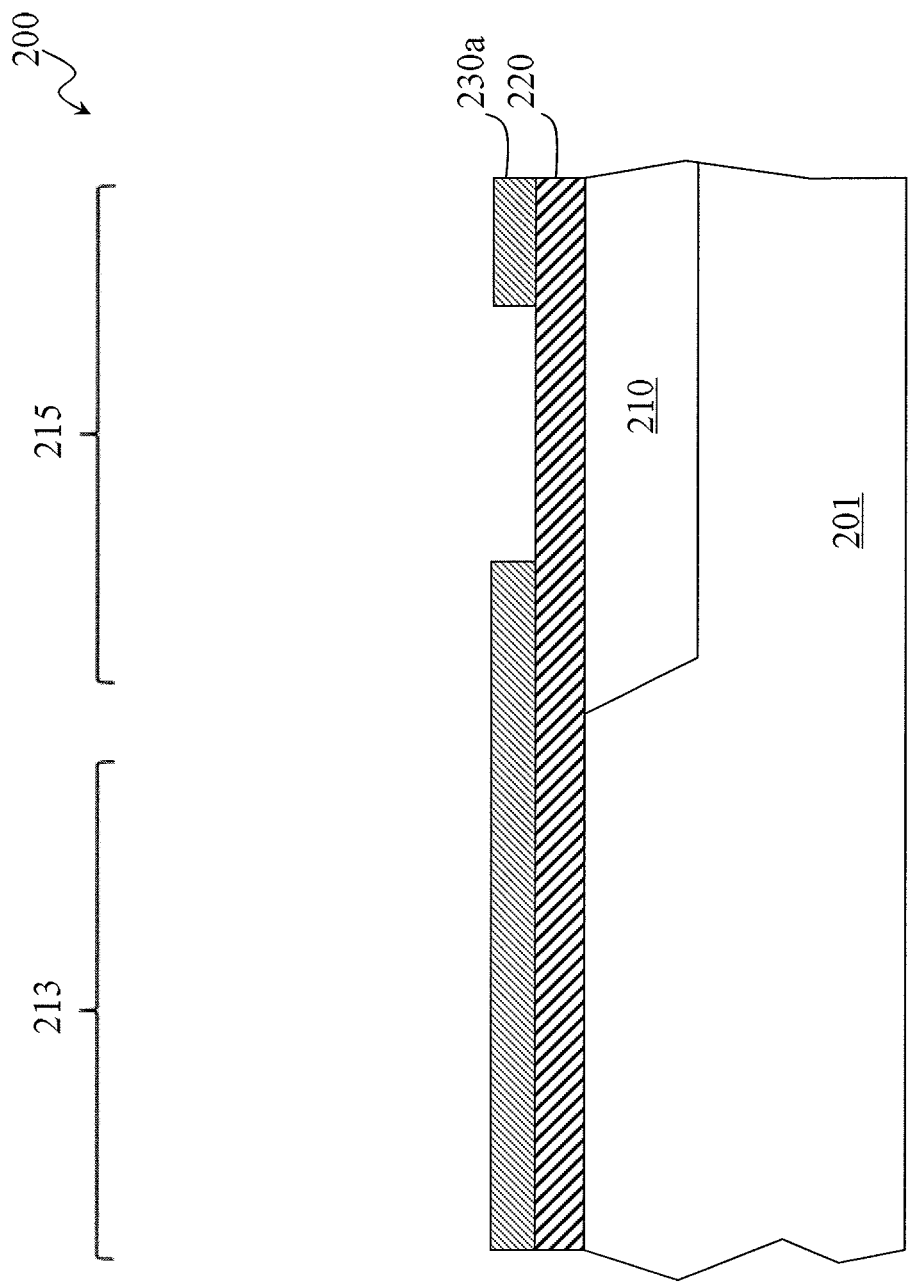

Referring to FIG. 2D, an etch process 246 uses the mask layer 245 as an etch mask to remove the exposed diffusion barrier material 230 (shown in FIG. 2C), exposing a portion of the gate dielectric stack 220. In some embodiments, the etch process 246 includes a dry etch process, a wet etch process, and/or any combinations thereof. After the mask layer 245 is removed, the remaining diffusion barrier material 230a is exposed as shown in FIG. 2E.

In some embodiments, the etch process 246 optionally removes a portion of the gate dielectric stack 220, such that a portion of the STI feature 210 is exposed. Because an electrical fuse is designed to be formed in the electrical fuse region 215, a semiconductor material 250 (described below in FIG. 2F) may directly contact the STI feature 210.

Figure 2F:
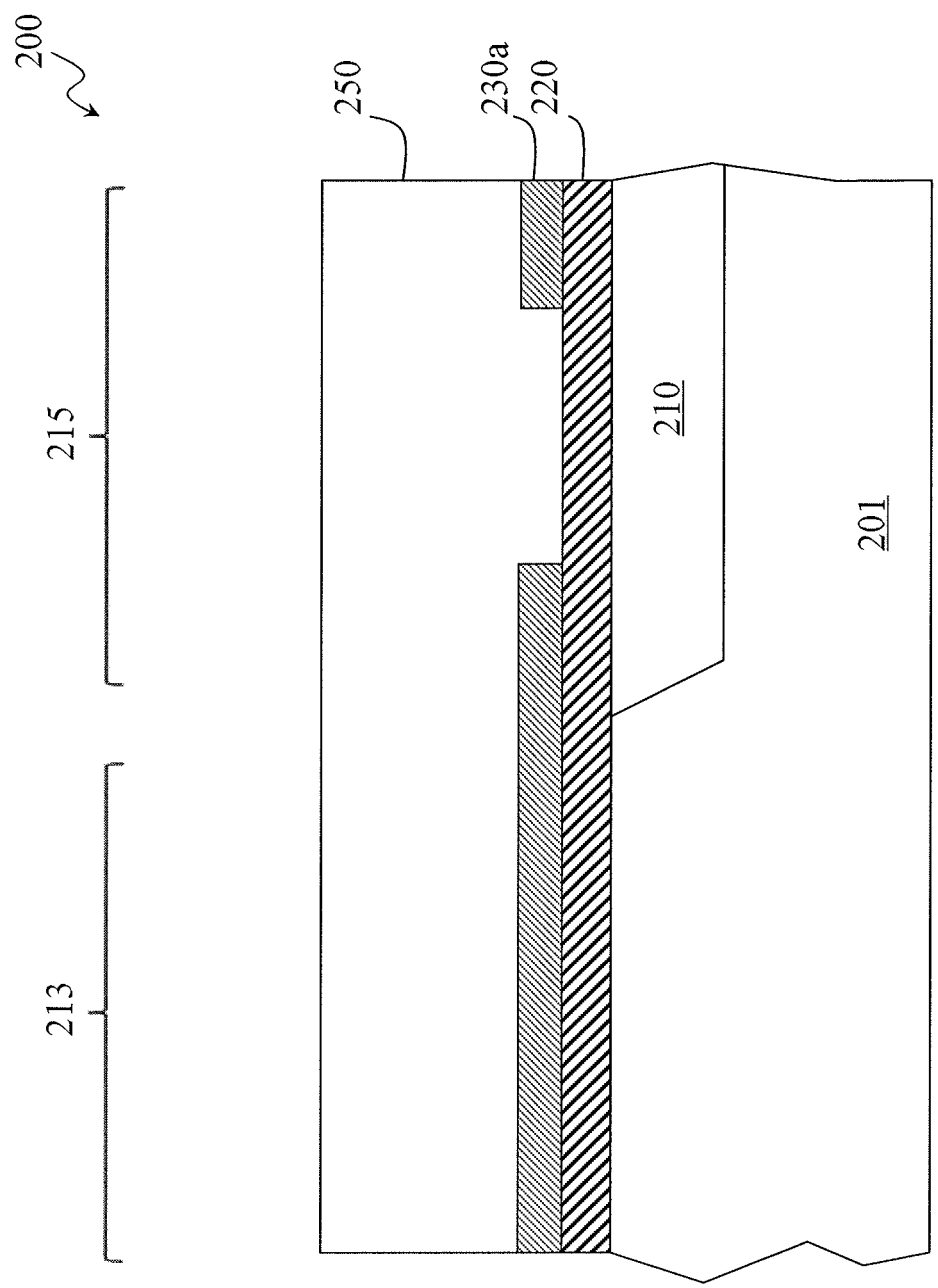

Referring to FIG. 2F, the semiconductor material 250 is disposed over the remaining diffusion barrier material 230a and the exposed portion of the gate dielectric stack 220. In some embodiments, the semiconductor material 250 is made of, for example, silicon, polysilicon, amorphous silicon, crystalline silicon, or any combinations thereof. The semiconductor material 250 may be formed by chemical vapor deposition (CVD) or any suitable technique. In some embodiments, the semiconductor material 250 can be doped, e.g., in-situ doped, or undoped.

Figure 2G:
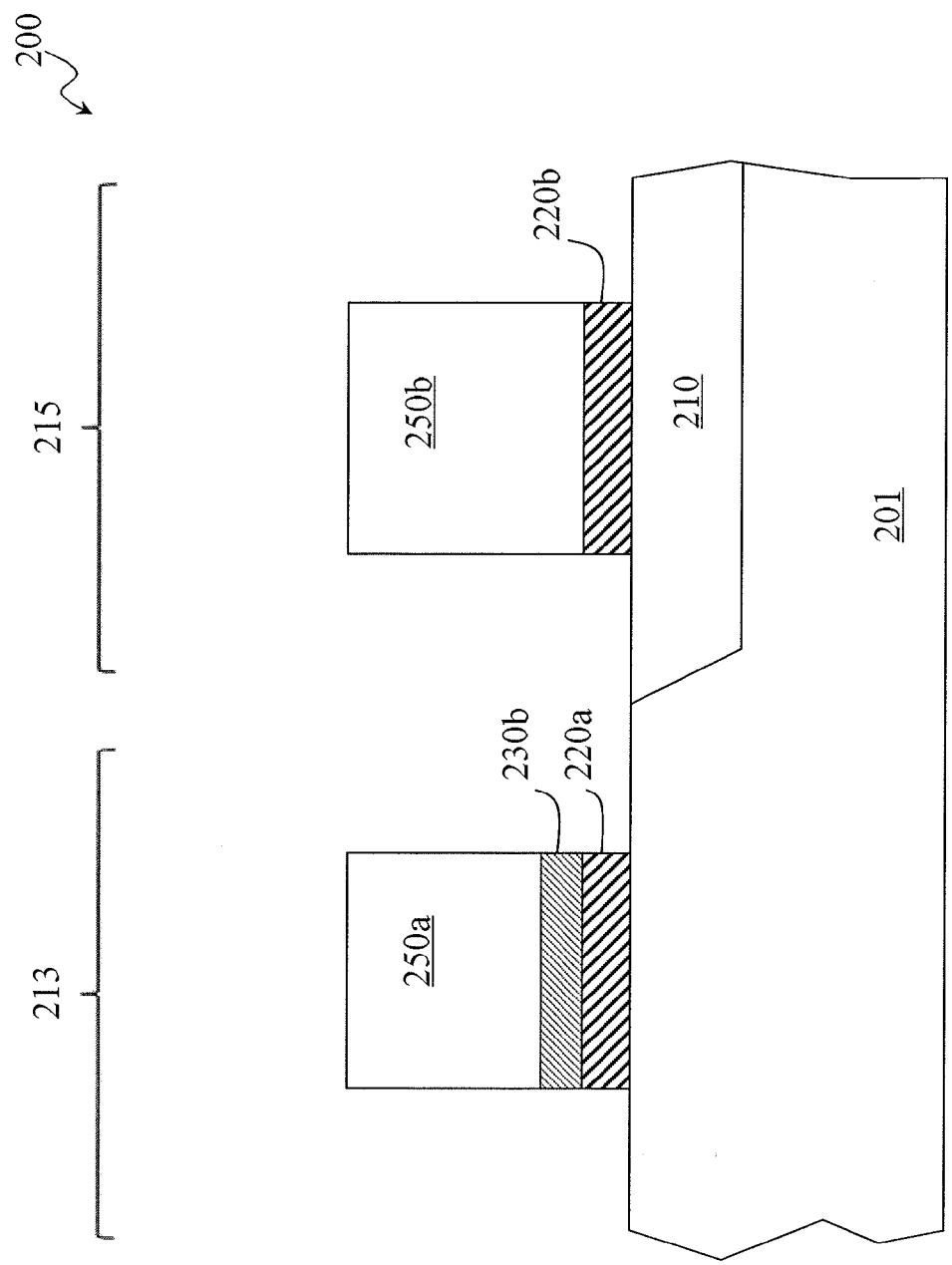

Referring to FIG. 2G, a patterning process is performed to pattern the semiconductor material 250, the remaining diffusion barrier material 230a and the gate dielectric stack 220 (shown in FIG. 2F). By the patterning process, gate dielectric structures 220a and 220b are formed over the substrate 201, which are disposed in the transistor region 213 and the electrical fuse region 215, respectively. A diffusion barrier 230b is formed over the gate dielectric structure 220a. A semiconductor layer 250a is formed over the diffusion barrier 230b. A semiconductor layer 250b is formed and directly contacts the gate dielectric structure 220b.

Figure 2H:
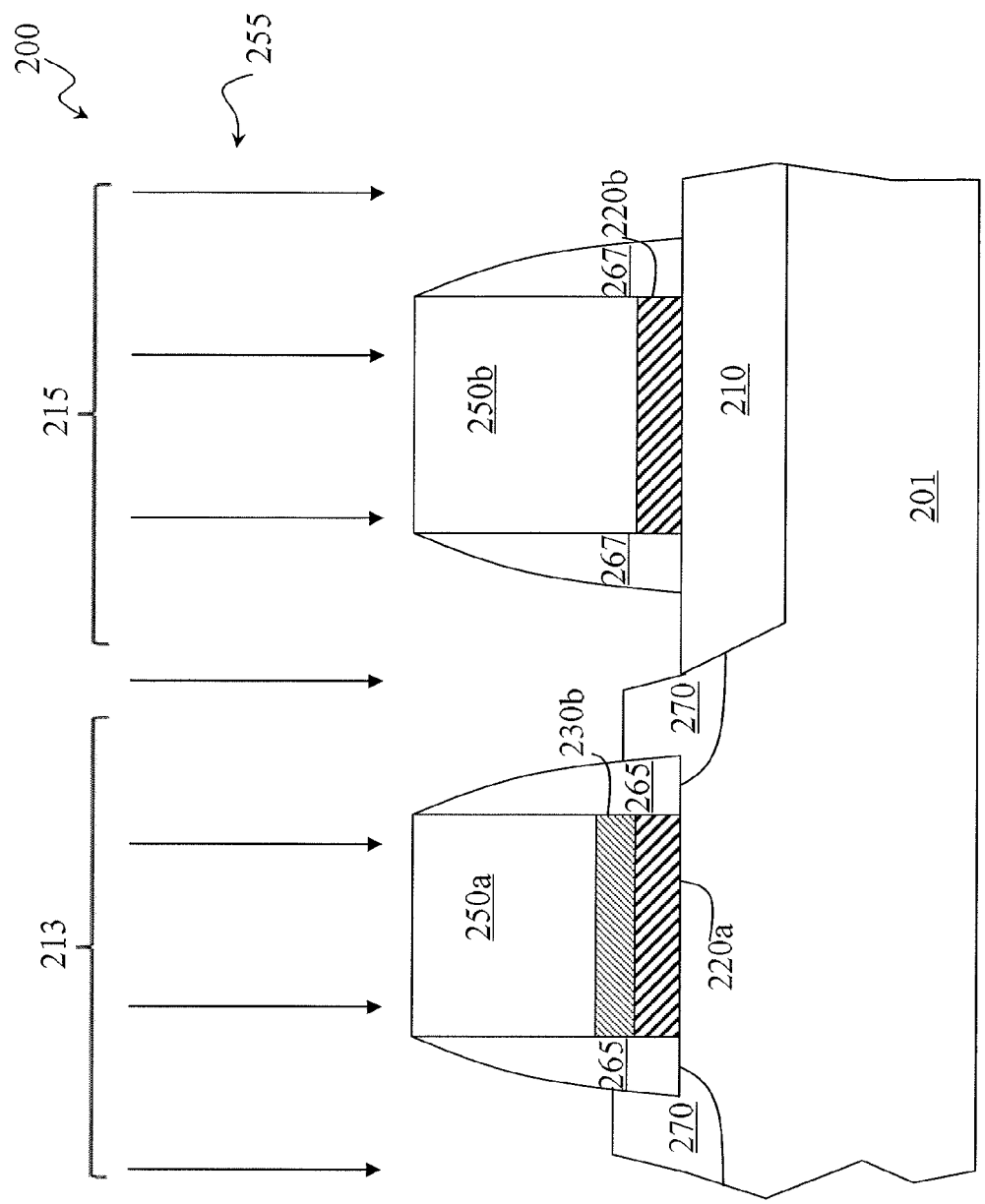

Referring to FIG. 2H, at least one implantation process 255 is performed to implant dopants into the substrate 201 to form a source/drain (S/D) region 270 adjacent to each sidewall of the gate dielectric structure 220a. In some embodiments, the implantation process 255 includes a lightly doped drain (LDD) implantation and/or a heavily-doped S/D implantation. In some embodiments, a thermal process and/or a rapid thermal process (RTP) are performed to activate dopants in the S/D regions 270.

In some embodiments forming LDD regions, the implantation process 255 includes a lightly doped drain implantation forming a LDD region (not shown) in portions of the substrate 201 adjacent to each side of the gate dielectric structure 220a. The LDD regions may be formed by an ion implantation process and/or a diffusion process. N-type dopants, such as phosphorus or arsenic, may be used to form an NMOS device, and P-type dopants, such as boron, may be used to form a PMOS device.

After the formation of the LDD regions, spacers 265 and 267 are formed on sidewalls of the silicon layer 250a and 250b, respectively. The spacers 265 and 267 are formed by using a deposition process and an etching process (for example, an anisotropic etching process). The spacers 265 and 267 include a suitable dielectric material, such as silicon nitride, silicon oxide, silicon carbide, silicon oxynitride, or combinations thereof. Thereafter, the heavily-doped S/D implantation is performed to dope the S/D regions 270. N-type dopants, such as phosphorus or arsenic, can be used to form an NMOS device, and P-type dopants, such as boron, can be used to form a PMOS device.

In some embodiments, the implantation process 255 dopes the S/D regions 270 as well as the semiconductor layer 250b simultaneously. In other embodiments, doping the S/D regions 270 and the semiconductor layer 250b are separated. For example, the semiconductor layer 250b is in-situ doped as described above in conjunction with FIG. 2F. In other embodiments, the top surface of the semiconductor layer 250b is covered by a mask layer (not shown) while the implantation process 255 is performed, such that the implantation process 255 does not dope the semiconductor layer 250b.

In some embodiments, the integrated circuit 200 can include at least one stressor (not labeled) in each the S/D region 270. The stressors may be formed after the LDD formation and before the heavily-doped S/D implantation. The stressors are configured to provide a stress to a channel (not labeled) of the transistor. The stressed channel can modify a mobility of carriers therein so as to change electrical characteristics, e.g., electrical current, of the transistor. In some embodiments, the stressor in each of the S/D regions 270 is referred to as a raised S/D region. In some embodiments, the stressors are formed by an epitaxial process, a RPCVD process, a molecular beam epitaxy (MBE) process, a CVD process, an MOCVD process, an ALD process, a multi-layer epitaxial process, or any combinations thereof.

In some embodiments forming a P-type transistor, the stressor includes a single SiGe or $Si_xGe_{1-x}$ layer, a multi-layer SiGe or $Si_xGe_{1-x}$ structure, an epitaxial structure, a compound material structure, other materials that can modify the carrier mobility of the transistor, or any combinations thereof. In other embodiments forming an N-type transistor, the stressor includes a single SiC or $Si_xC_{1-x}$ layer, a multi-layer SiC or $Si_xC_{1-x}$ structure, an epitaxial structure, a compound material structure, other materials that can modify the carrier mobility of the transistor, or any combinations thereof.

Figure 2I:
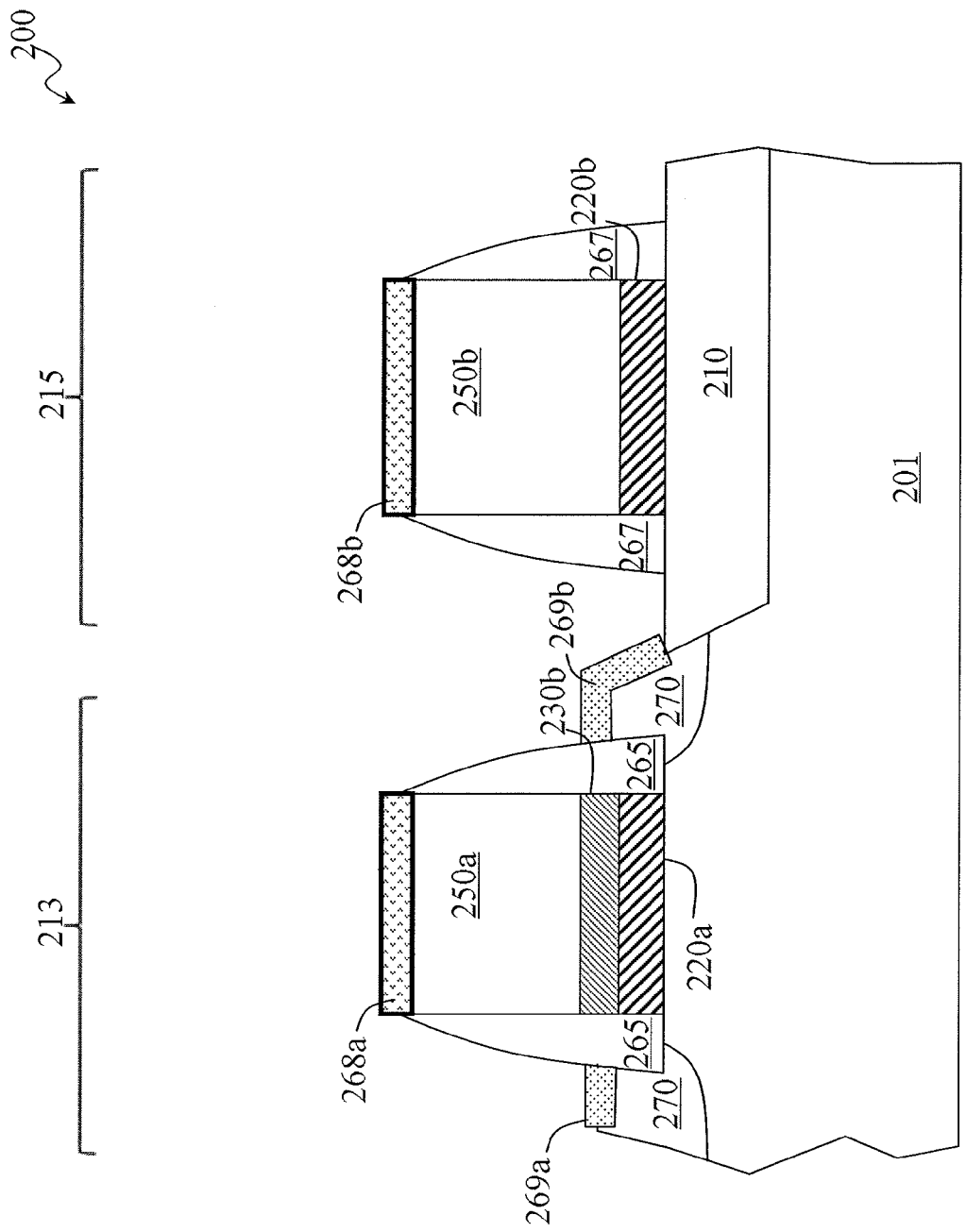

Referring to FIG. 2I, silicide layers 268a-268b and 269a-269b are formed on the respective semiconductor layers 250a, the semiconductor layer 250b, and the S/D regions 270. In some embodiments, the silicide layer 268a-268b and 269a-269b include at least one material such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, or any combinations thereof.

It is noted that the formation of the silicide layer 268a on the semiconductor layer 250a is optional. In some embodiments, the formation of the silicide layer 268a on the semiconductor layer 250a is carried out by the process for forming the silicide layers 0269a-269b on the S/D regions 270. In other embodiments, the silicide layer 268a is not formed on the top surface of the semiconductor layer 250a. For example, the top surface of the semiconductor layer 250a is covered with a dielectric layer, e.g., a nitride layer, while the salicidation process is performed.

Figure 2J:
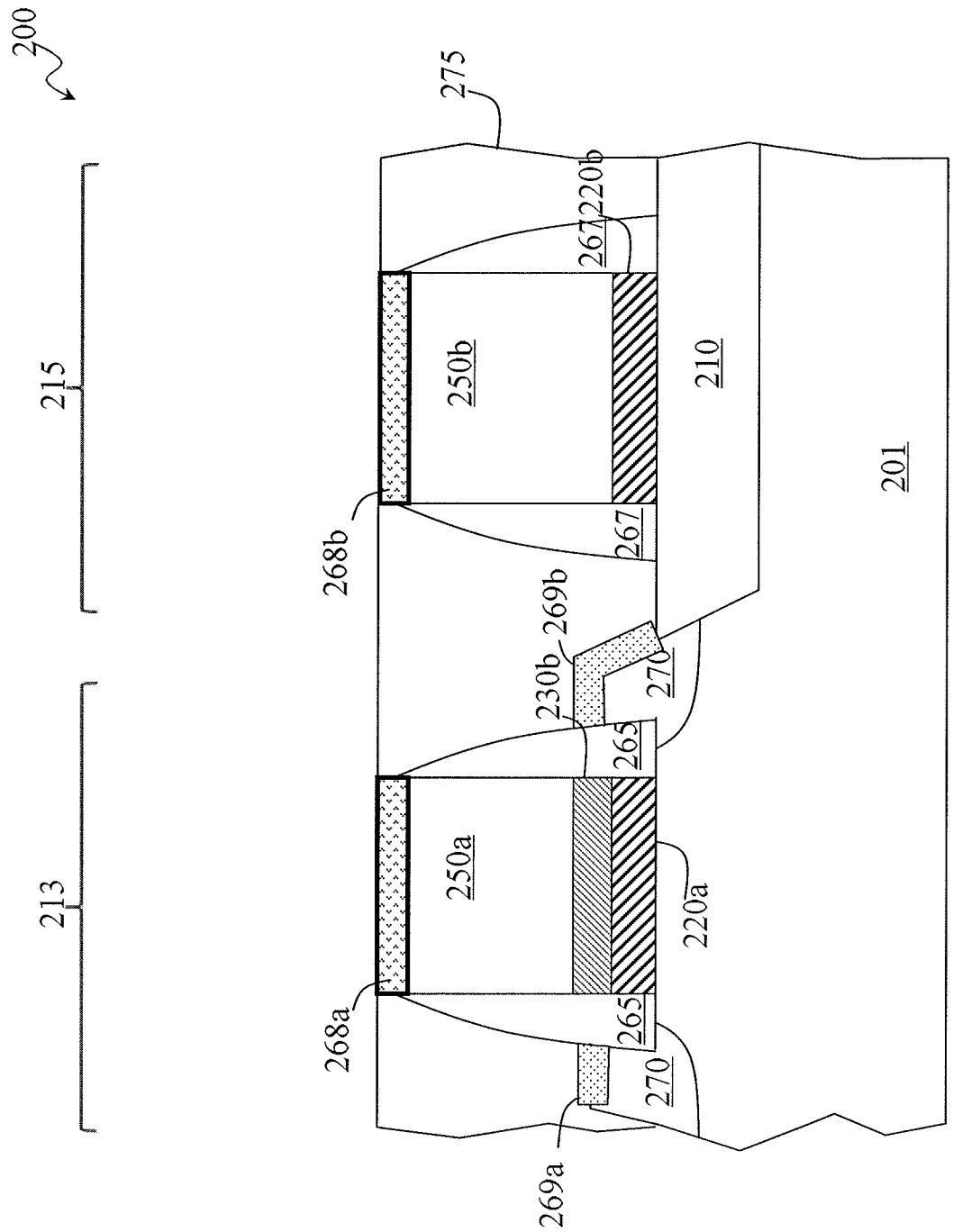

Referring to FIG. 2J, at least one dielectric layer, e.g., a dielectric layer 275, is formed over the substrate 201 and around the spacers 265 and 267. In some embodiments, the dielectric layer 275 includes at least one material such as phosphorous-doped silicate glass (PSG), boron-doped silicate glass (BSG), boron-phosphorous-doped silicate glass (BPSG), undoped silicate glass (USG), silicon oxide, silicon nitride, silicon oxynitride, low-k dielectric material, other dielectric materials, and/or any combinations thereof. In some embodiments, the top surfaces of the silicide layers 268a and 268b are substantially leveled with the top surface of the dielectric layer 275.

Figure 2K:
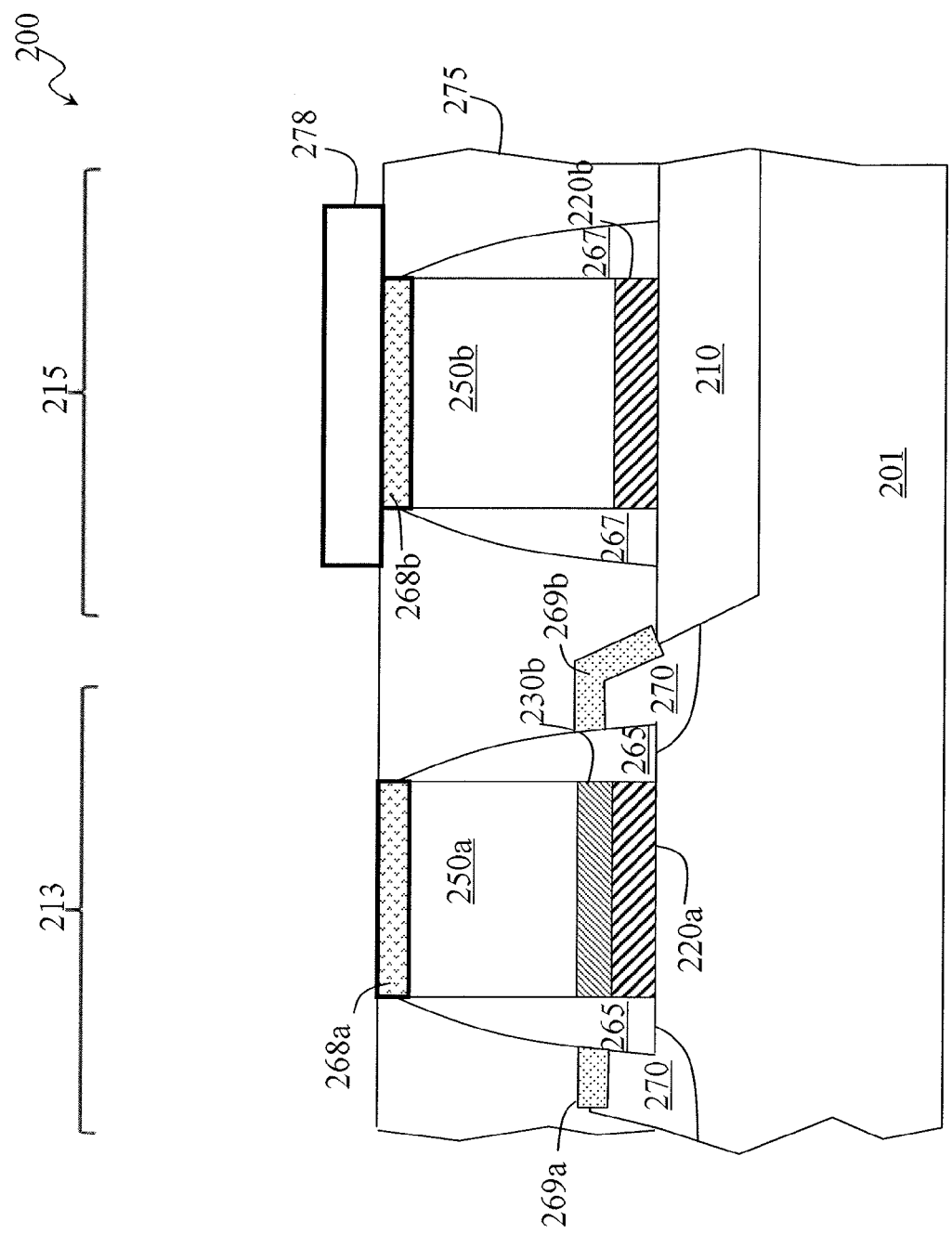

Referring to FIG. 2K, a mask layer 278, e.g., silicon oxide, silicon nitride, silicon oxynitride, silicon carbide, silicon oxycarbide, other dielectric materials, and/or any combinations thereof, is formed, covering the top surface of the silicide layer 268b. The mask layer 278 is configured to prevent the silicide layer 268b from being removed, whereas the silicide layer 268a and the semiconductor layer 250a are removed later.

Figure 2L:
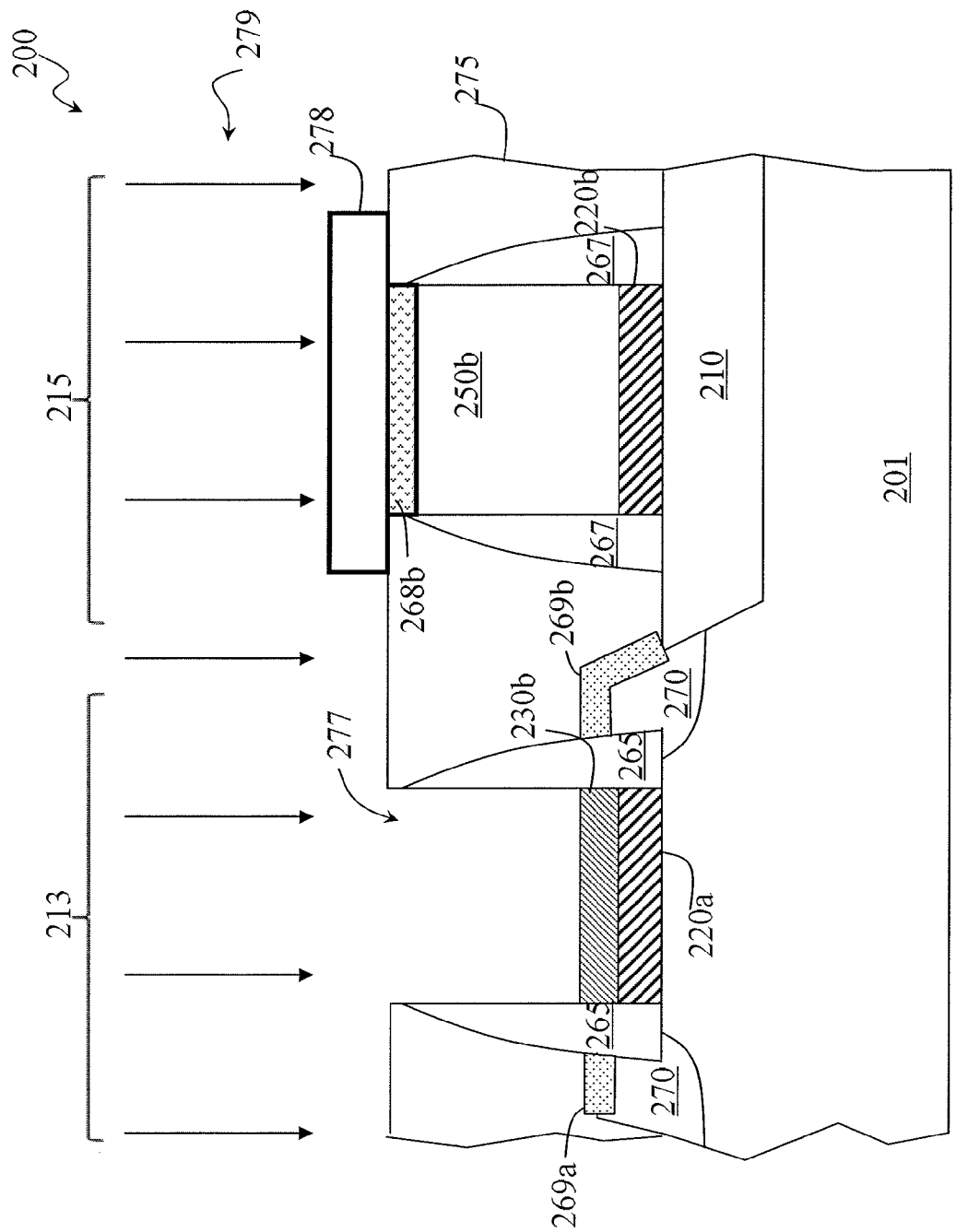

Referring to FIG. 2L, a removal process 279 removes the silicide layer 268a and the semiconductor layer 250a. The removed silicide layer 268a and the semiconductor layer 250a leave an opening 277 as shown in FIG. 2L. The removal process 279 includes, for example, a wet etch process, a dry etch process, and/or any combinations thereof. In some embodiments, the semiconductor layer 250a is referred to as a dummy gate electrode that is removed during a gate-last high-k/metal-gate process.

Figure 2M:
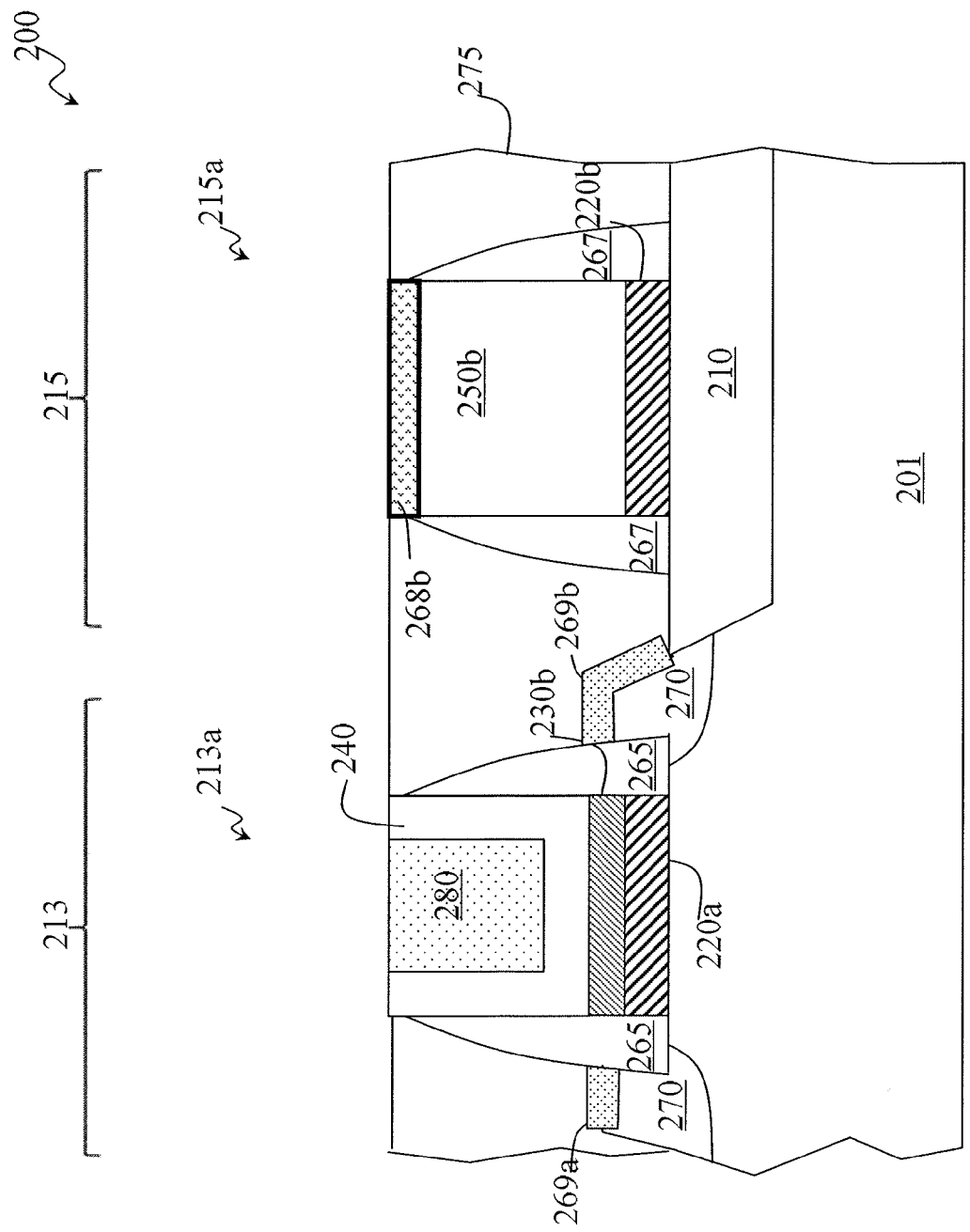

Referring to FIG. 2M, a work-function metallic layer 240 is formed in the opening 277 (shown in FIG. 2L) and over the diffusion barrier 230b. In some embodiments, the work-function metallic layer 240 includes at least one P-type work-function metallic material and/or at least one N-type work-function metallic material. In some embodiments, the P-type work-function metallic layer includes compositions such as ruthenium, palladium, platinum, cobalt, nickel, and conductive metal oxides, and/or other suitable materials. The N-type metal material includes compositions such as hafnium, zirconium, titanium, tantalum, aluminum, metal carbides (e.g., hafnium carbide, zirconium carbide, titanium carbide, aluminum carbide), aluminides, and/or other suitable materials. In some embodiments, the work-function metallic layer 240 is formed, for example, by any suitable process, such as an ALD process, CVD process, an RPCVD process, a PECVD process, an MOCVD process, or any combinations thereof.

Referring again to FIG. 2M, a conductive layer 280 is formed in the opening 277 (shown in FIG. 2L) and surrounded by the work-function metallic layer 240. A top surface of the conductive layer 280 is substantially leveled with a top surface of the silicide layer 268b. As shown, the transistor 213a and a resistor structure of the electrical fuse 215a are formed over the substrate 201. In some embodiments, the conductive layer 280 is made of at least one material, such as aluminum, copper, Ti, TiN, TaN, Ta, TaC, TaSiN, W, WN, MoN, MoON, $RuO_2$, and/or other suitable materials. In some embodiments, the conductive layer 280 is formed by any suitable process, such as an ALD process, a CVD process, a physical vapor deposition (PVD) process, an RPCVD process, a PECVD process, an MOCVD process, a plating process, a sputtering process, or any combinations thereof.

As shown in FIG. 2M, the transistor 213a has the conductive layer 280 serving for electrical connection. The conductive layer 280 has the desired electrical migration reliability during the operation of the transistor 213a. Different from the transistor 213a, the electrical fuse 215a has the semiconductor layer 250b and the silicide layer 268b. For programming the electrical fuse 215a, a current flows through and blows out the electrical fuse 215a. Accordingly, the transistor 213a and the electrical fuse 215a are formed by different materials. The gate-last HK/MG process described above in conjunction with FIGS. 2A-2M provides forming different materials for the gate of the transistor 213a and the electrical fuse 215a.

Referring again to FIG. 2M, the diffusion barrier 230b is formed between the gate dielectric structure 220a and the work-function metallic layer 240. The formation of the work-function metallic layer 240 is after the formation of the silicide layer 268b. The formation of the diffusion barrier 230b is before the formation of the silicide layer 268b as shown in FIG. 2I. Not seeing the thermal cycle of the formation of silicide layer 268b, the work-function metallic layer 240 maintains its intended work function and does not substantially interact with the diffusion barrier 230b.

It is also noted, the processes and/or structures described above in conjunction with FIGS. 2A-2M are merely exemplary. The scope of this application is not limited thereto. For example, as described in conjunction with FIG. 2D, the etch process 246 optionally removes portions of the diffusion barrier material 230 and the gate dielectric stack 220, such that a portion of the STI feature 210 is exposed. In at least this embodiment, the semiconductor layer 250b formed in FIG. 2M directly contacts the STI feature 210.

It is understood that additional processes may be performed to complete the fabrication of the integrated circuit 200. For example, these additional processes may include forming dielectric materials, contact or via plugs, metallic regions, and/or metallic lines (not shown) over the conductive layer 280 and the silicide layer 268b for interconnection. The dielectric layers may include materials such as silicon oxide, silicon nitride, silicon oxynitride, low-k dielectric material, ultra low-k dielectric material, or any combinations thereof. The contact/via plugs, metallic regions, and/or metallic lines can include materials such as tungsten, aluminum, copper, titanium, tantalum, titanium nitride, tantalum nitride, nickel silicide, cobalt silicide, other proper conductive materials, and/or combinations thereof. The contact/via plugs, metallic regions, and/or metallic lines can be formed by any suitable processes, such as deposition, photolithography, chemical mechanical polishing (CMP) process, and etching processes, and/or combinations thereof. For the sake of simplicity, these additional processes are not described herein.

FIGS. 3A-3H are schematic cross-sectional views of an integrated circuit during another gate-last high-k metal-gate fabrication stages along the section line C-C of FIG. 1B. Items of FIGS. 3A-3H that are the same or similar items in FIGS. 2A-2M are indicated by the same reference numerals, increased by 100. It is understood that FIGS. 3A-3H have been simplified for a better understanding of the concepts of the present disclosure. Accordingly, it should be noted that additional processes may be provided before, during, and/or after FIGS. 3A-3H, and that some other processes may only be briefly described herein.

Figure 3A:
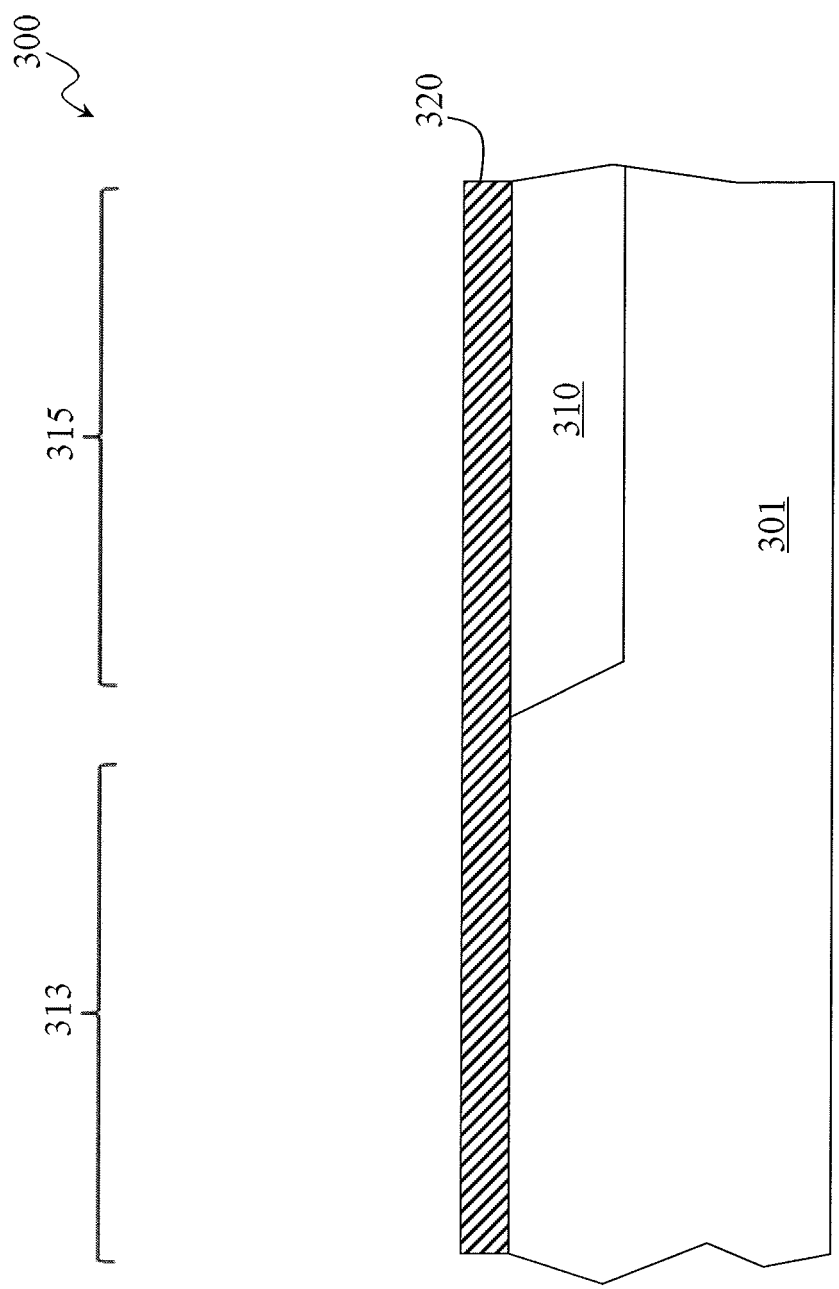
FIGS. 3A-3H are schematic cross-sectional views of an integrated circuit during other gate-last high-K metal gate fabrication stages.

Referring now to FIG. 3A, an integrated circuit 300 is fabricated over a substrate 301. The integrated circuit 300 includes a transistor region 313 and a electrical fuse region 315. The integrated circuit 300 includes an isolation structure, e.g., a shallow trench isolation (STI) feature 310 that is formed in the substrate 301. A gate dielectric stack 320 is formed over the substrate 301.

Figure 3B:
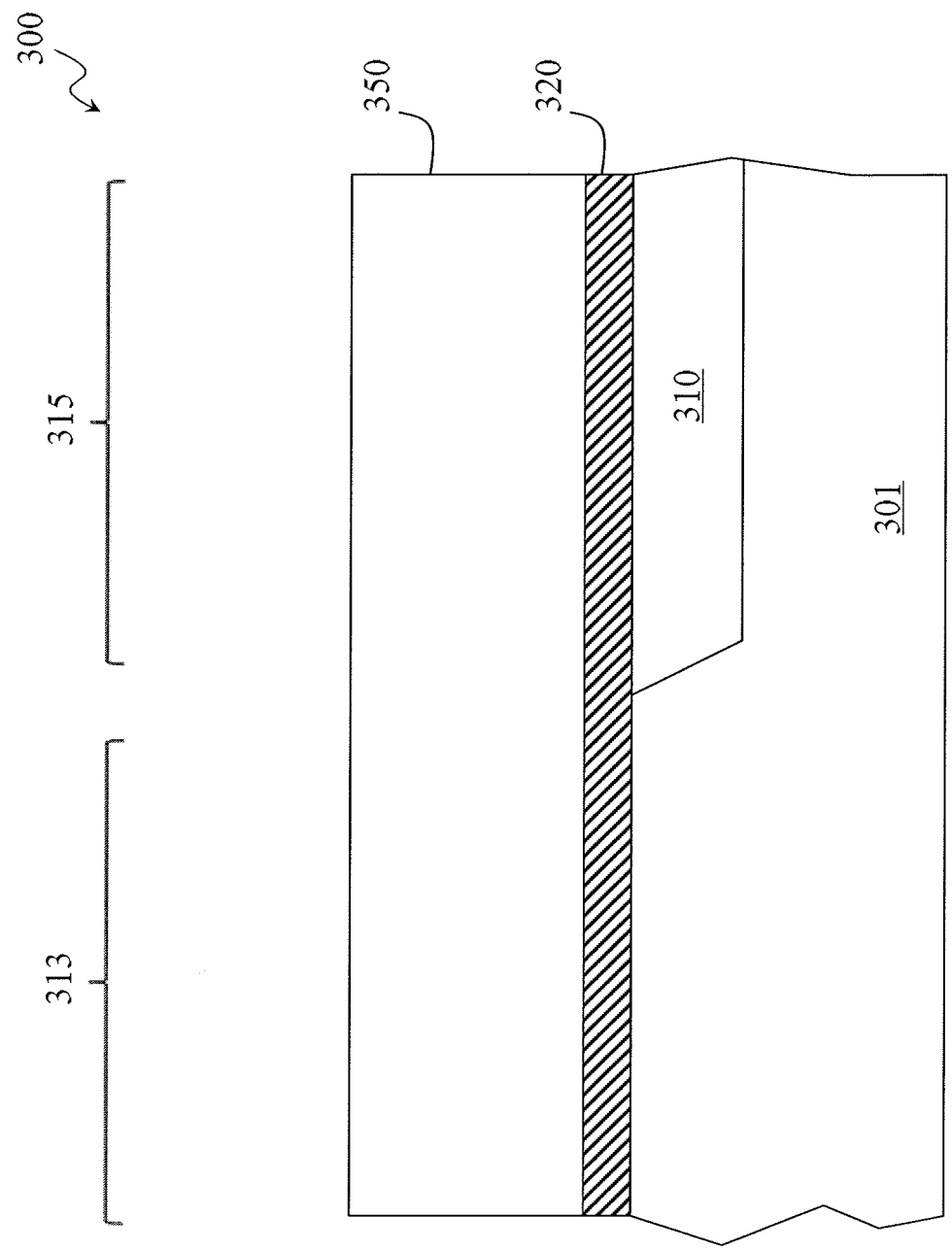

Referring to FIG. 3B, a semiconductor material 350 is formed over the gate dielectric stack 320. In some embodiments, the semiconductor material 350 continuously extends from the transistor region 313 to the electrical fuse region 315. In some embodiments, the semiconductor material 350 is undoped or doped with N-type or P-type dopants.

Figure 3C:
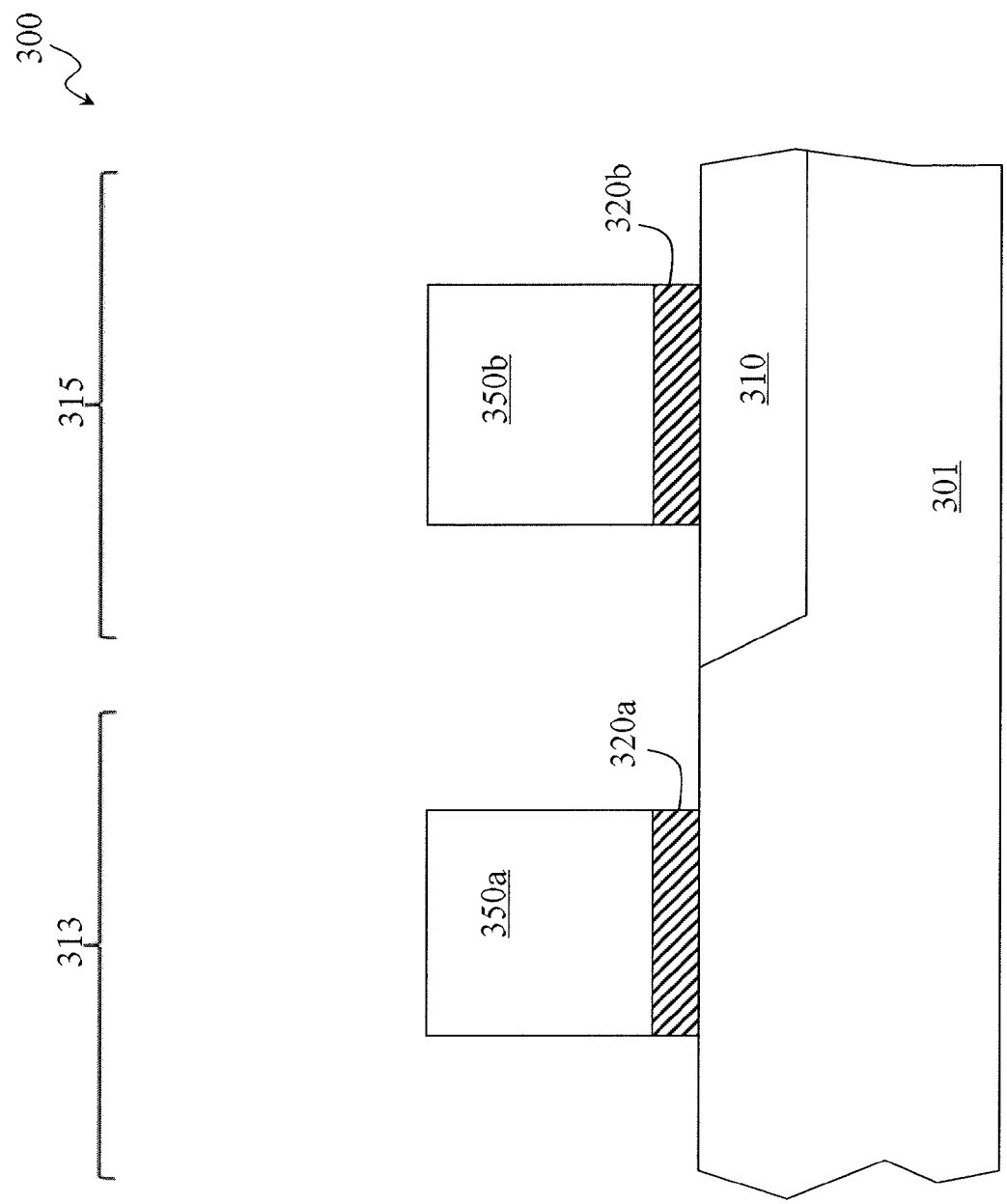

Referring to FIG. 3C, a patterning process is performed to pattern the semiconductor material 350 and the gate dielectric stack 320 (shown in FIG. 3B). By the patterning process, gate dielectric structures 320a and 320b are formed over the substrate 301 in the transistor region 313 and the electrical fuse region 315, respectively. Semiconductor layers 350a and 350b are formed over the gate dielectric structures 320a and 320b, respectively.

Figure 3D:
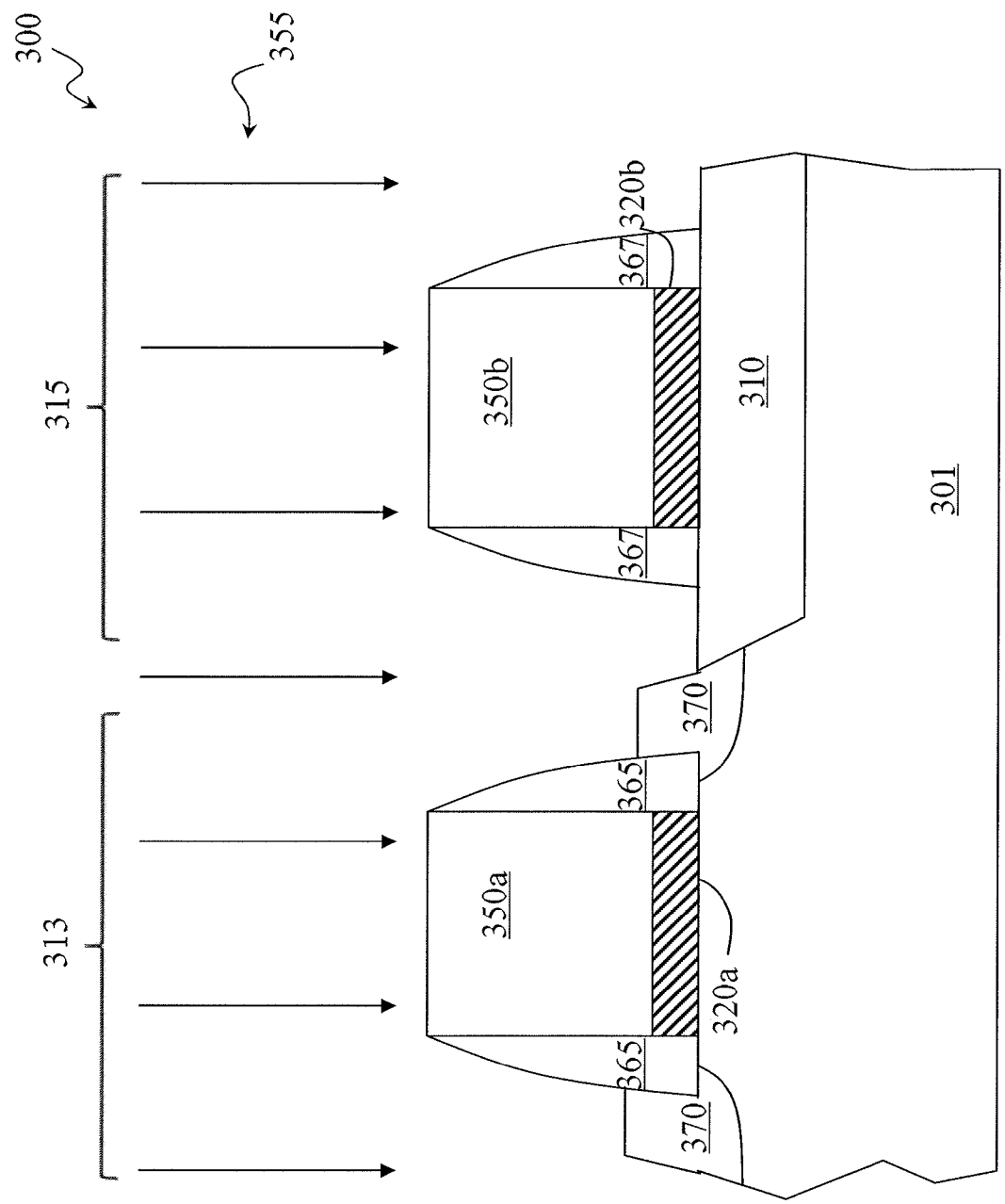

Referring to FIG. 3D, at least one implantation process 355 is performed to implant dopants into the substrate 301 to form a source/drain (S/D) region 370 adjacent to each sidewall of the gate dielectric structure 320a. Spacers 365 and 367 are formed on sidewalls of the semiconductor layers 350a and 350b, respectively. It is noted that the process of forming the S/D regions 370 optionally includes the processes of forming the LDD regions, heavily doped S/D regions, and/or stressors described above in conjunction with FIG. 2H.

Figure 3E:
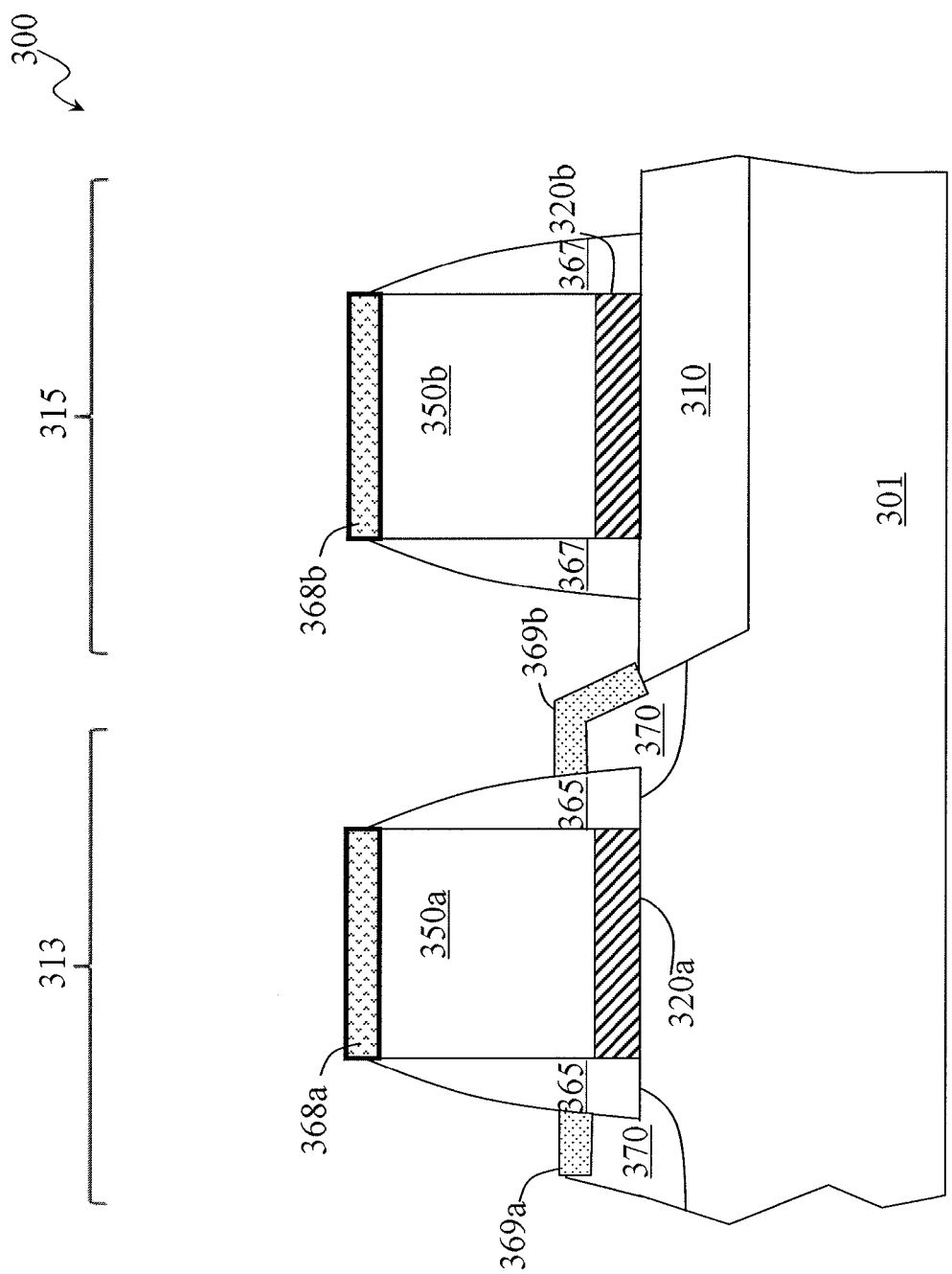

Referring to FIG. 3E, silicide layers 368a-368b and 369a-369b are formed on the respective semiconductor layers 350a, the semiconductor layer 350b, and the S/D regions 370. In some embodiments, the formation of the silicide layer 368a on the semiconductor layer 350a is optional. In some embodiments, the formation of the silicide layer 368a on the semiconductor layer 350a is carried out by the process for forming the silicide layers 369a-369b on the S/D regions 370. In other embodiments, the silicide layer 368a is not formed on the top surface of the semiconductor layer 350a. For example, the top surface of the semiconductor layer 350a is covered with a dielectric layer, e.g., a nitride layer, while the salicidation process is in progress.

Figure 3F:
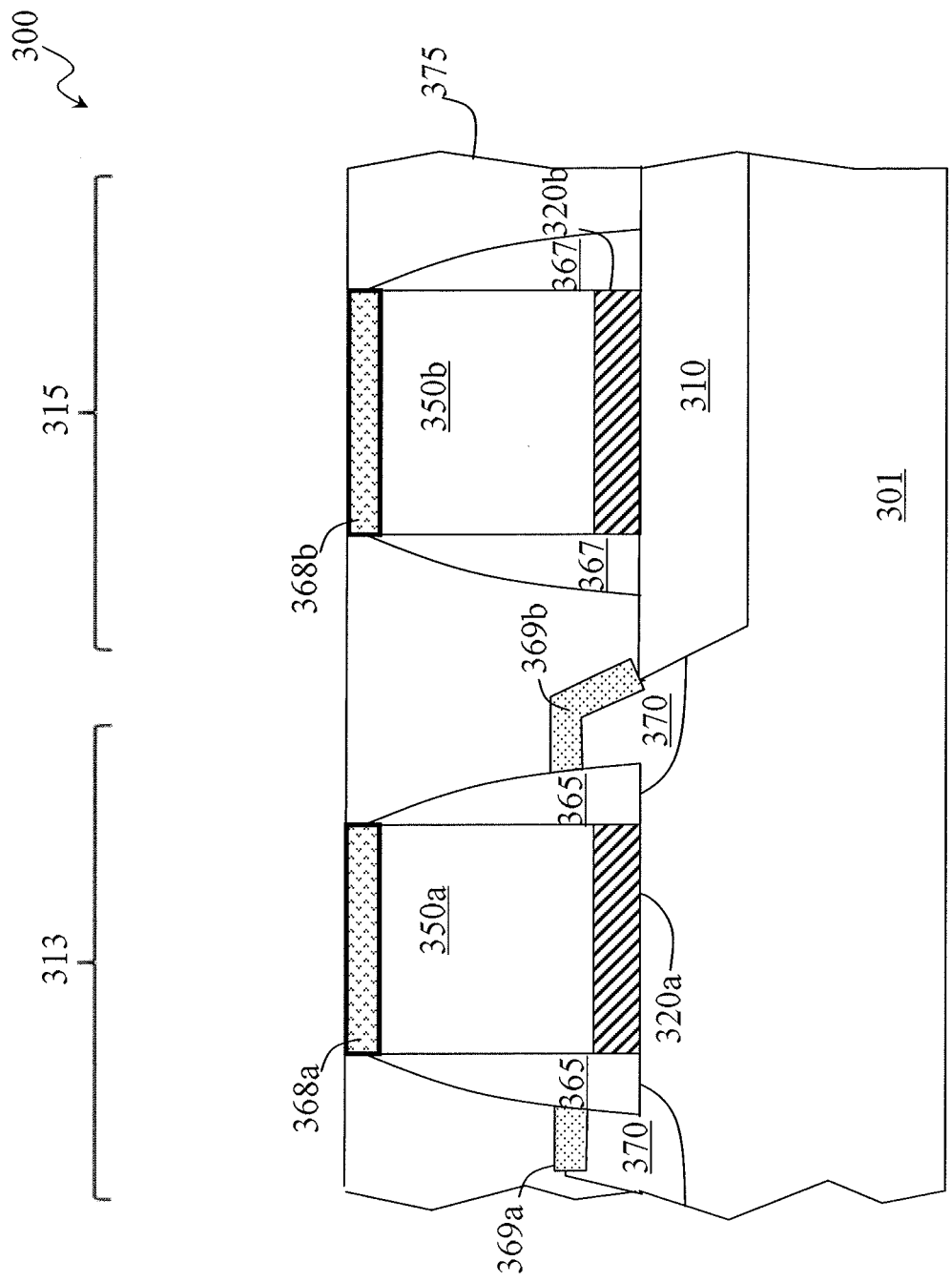

Referring to FIG. 3F, at least one dielectric layer, e.g., a dielectric layer 375, is formed over the substrate 301 and around the spacers 365 and 367. In some embodiments, the top surfaces of the silicide layers 368a-368b are substantially leveled with the top surface of the dielectric layer 375.

Figure 3G:
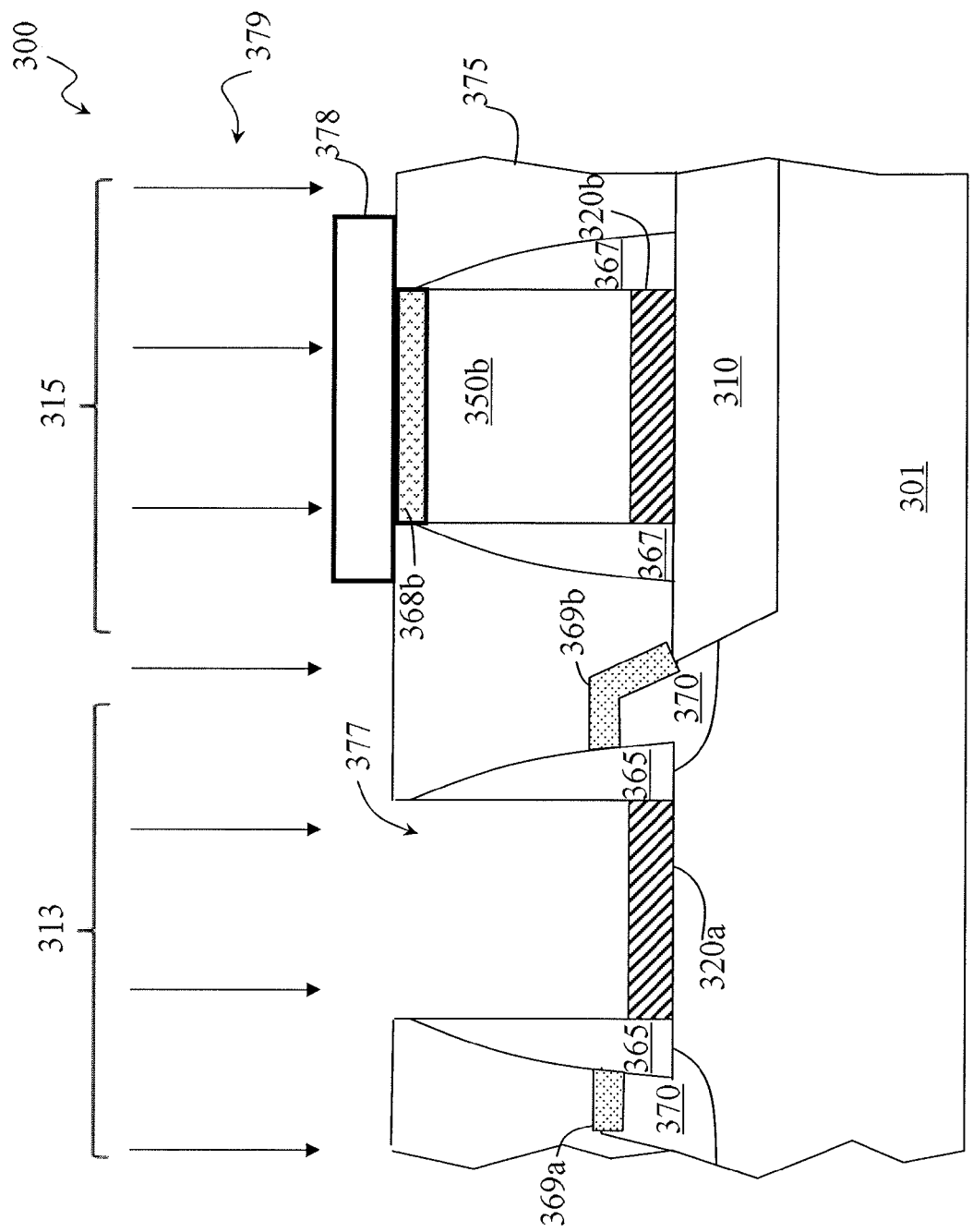

Referring to FIG. 3G, a mask layer 378, e.g., silicon oxide, silicon nitride, silicon oxynitride, other dielectric materials, and/or any combinations thereof, is formed, covering the top surface of the silicide layer 368b. A removal process 379 removes the silicide layer 368a and the semiconductor layer 350a (shown in FIG. 3F). The removal process 379 includes, for example, a wet etch process, a dry etch process, or any combinations thereof. The mask layer 378 is configured to prevent the silicide layer 368b and the semiconductor layer 350b from being removed, while the removal process 379 removes the silicide layer 368a and the semiconductor layer 350a. After removing the silicide layer 368a and the semiconductor layer 350a, an opening 377 is formed as shown in FIG. 3G.

Figure 3H:
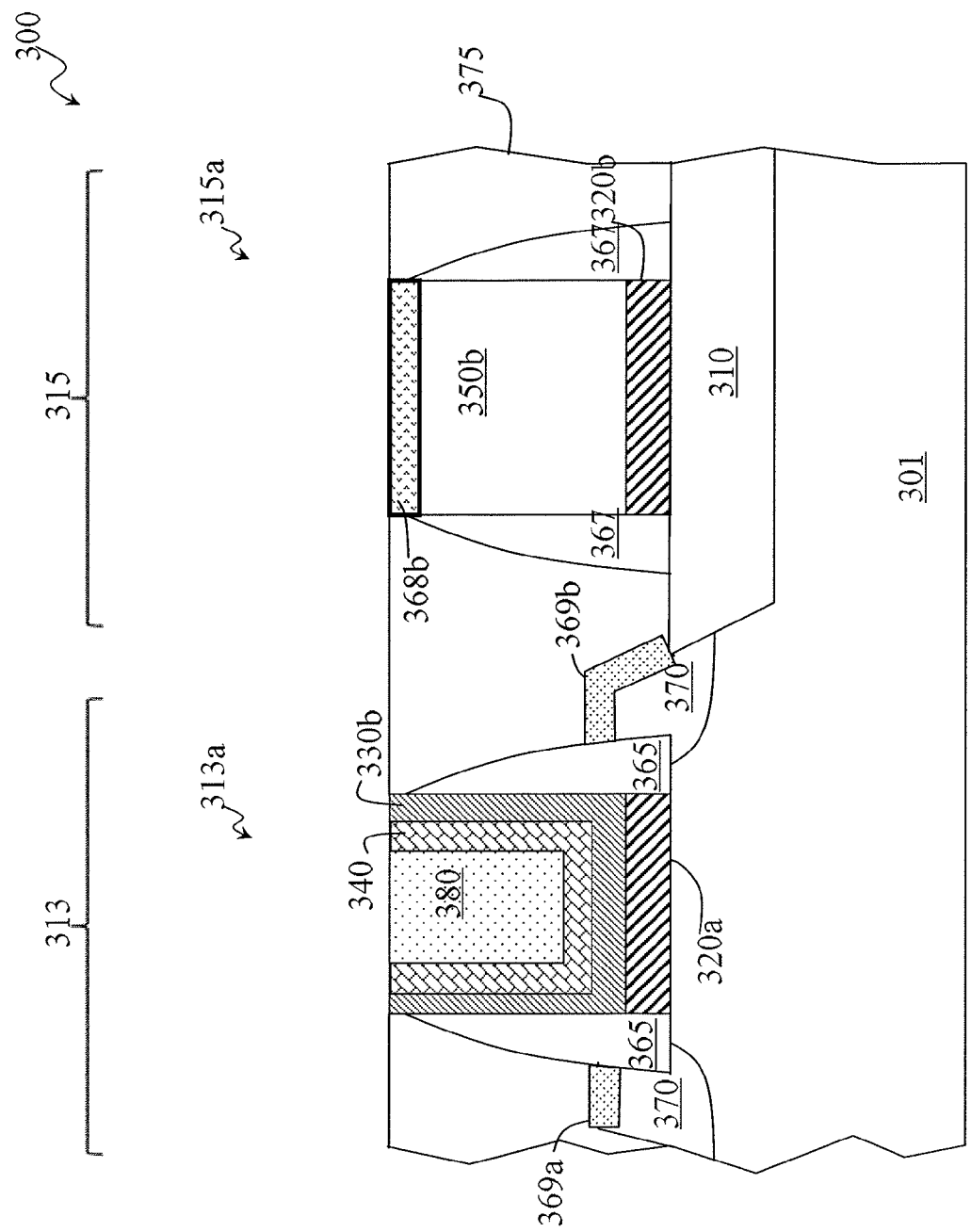

Referring to FIG. 3H, a diffusion barrier 330b, a work-function metallic layer 340 and a conductive layer 380 are sequentially disposed in the opening 377. The diffusion barrier 330b is formed over the gate dielectric structure 320a and along the sidewalls of the spacers 365. The diffusion barrier 330b is formed around the work-function metallic layer 340. The work-function metallic layer 340 is formed around the conductive layer 380. As shown in FIG. 3H, the diffusion barrier 330b is formed between the gate dielectric structure 320a and the work-function metallic layer 340. The formation of the diffusion barrier 330b is performed after the formation of the silicide layer 368b. Not seeing the thermal cycle of the formation of the silicide layer 368b, the work-function metallic layer 340 maintains its intended work function and does not substantially interact with the diffusion barrier 330b.

FIGS. 4A-4G are schematic cross-sectional views of an integrated circuit during various gate-first high-k metal-gate fabrication stages taken along the section line C-C. It is understood that FIGS. 4A-4F have been simplified for a better understanding of the concepts of the present disclosure. Accordingly, it should be noted that additional processes may be provided before, during, and/or after FIGS. 4A-4G, and that some other processes may only be briefly described herein.

Figure 4A:
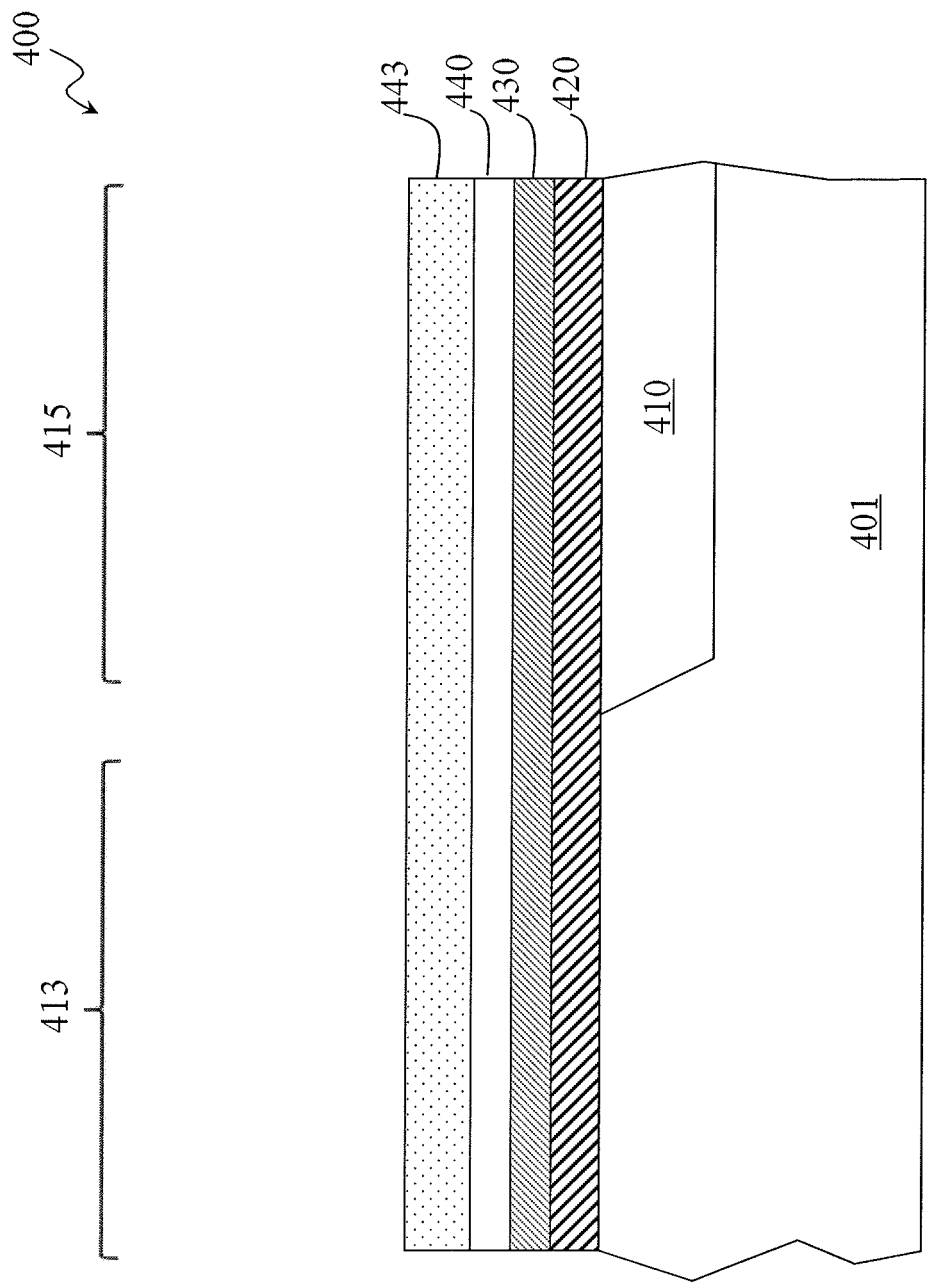
FIGS. 4A-4G are schematic cross-sectional views of an integrated circuit during various gate-first high-K metal gate fabrication stages.

Referring now to FIGS. 4A-4G, an integrated circuit 400 is fabricated over a substrate 401. Items of FIGS. 4A-4G that are the same or similar items in FIGS. 2A-2M are indicated by the same reference numerals, increased by 200. The integrated circuit 400 includes a transistor region 413 and an electrical fuse region 415. In FIG. 4A, an isolation structure, e.g., a shallow trench isolation (STI) feature 410, is formed in the substrate 401.

Referring again to FIG. 4A, a gate dielectric stack 420, a diffusion barrier material 430, a work-function metallic material 440 and a metallic layer 443 are sequentially formed over the substrate 401. In some embodiments, the metallic layer 443 is made of at least one material such as aluminum oxide, aluminum, aluminum nitride, tungsten, titanium, titanium nitride (TiN), tantalum, tantalum nitride, other suitable material, and/or combinations thereof.

Figure 4B:
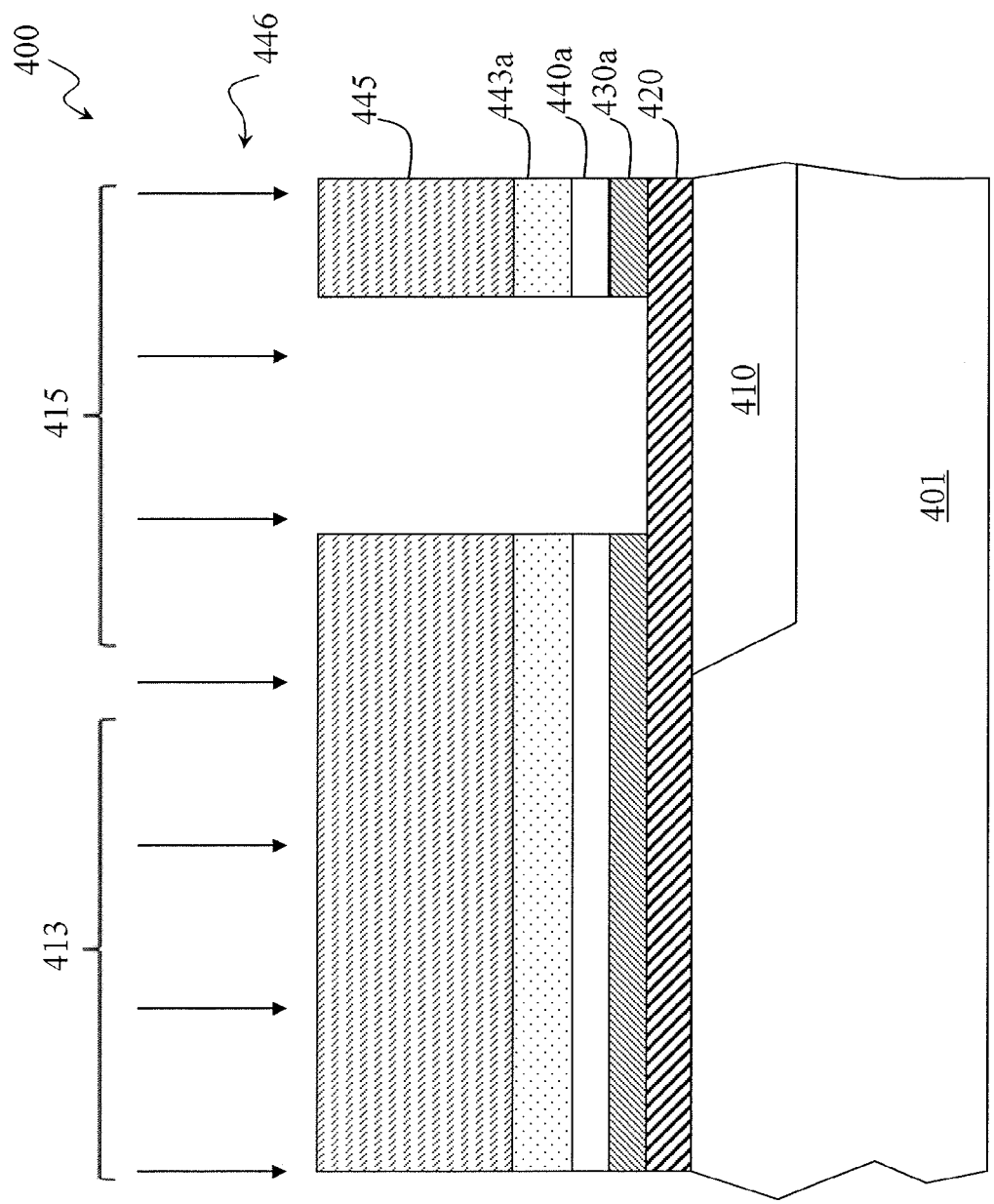
Figure 4C:
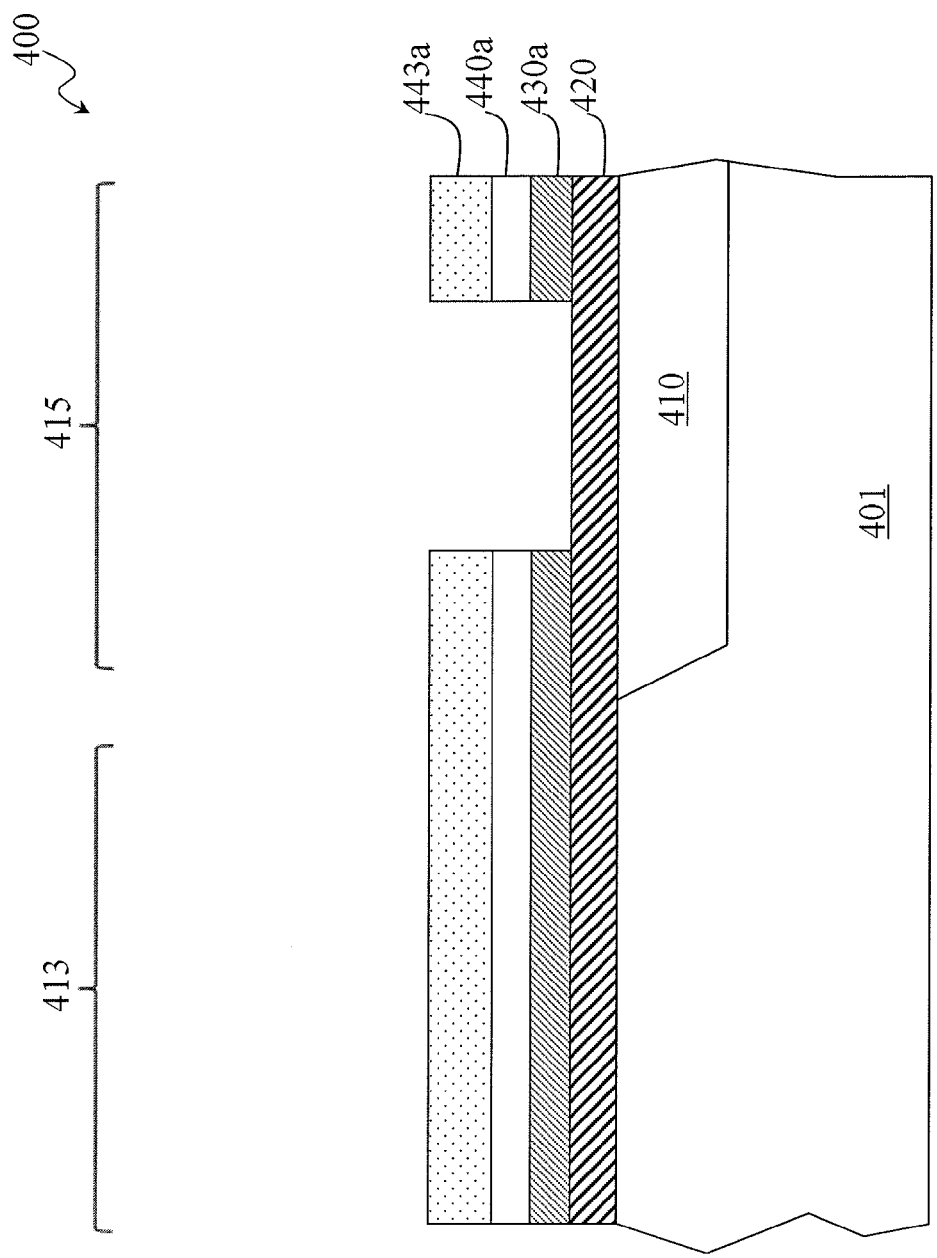

Referring to FIG. 4B, a mask layer 445 is formed over the metallic layer 443. An etch process 446 uses the mask layer 445 as an etch mask to remove portions of the metallic layer 443, the work-function metallic material 440 and the diffusion barrier material 430, exposing a portion of the gate dielectric stack 420. In some embodiments, the etch process 446 includes a dry etch process, a wet etch process, and/or any combinations thereof. After the mask layer 445 is removed, the remaining metallic layer 443a is exposed as shown in FIG. 4C. In some embodiments, the etch process 446 optionally removes a portion of the gate dielectric stack 420, such that a portion of the STI feature 410 is exposed.

Figure 4D:
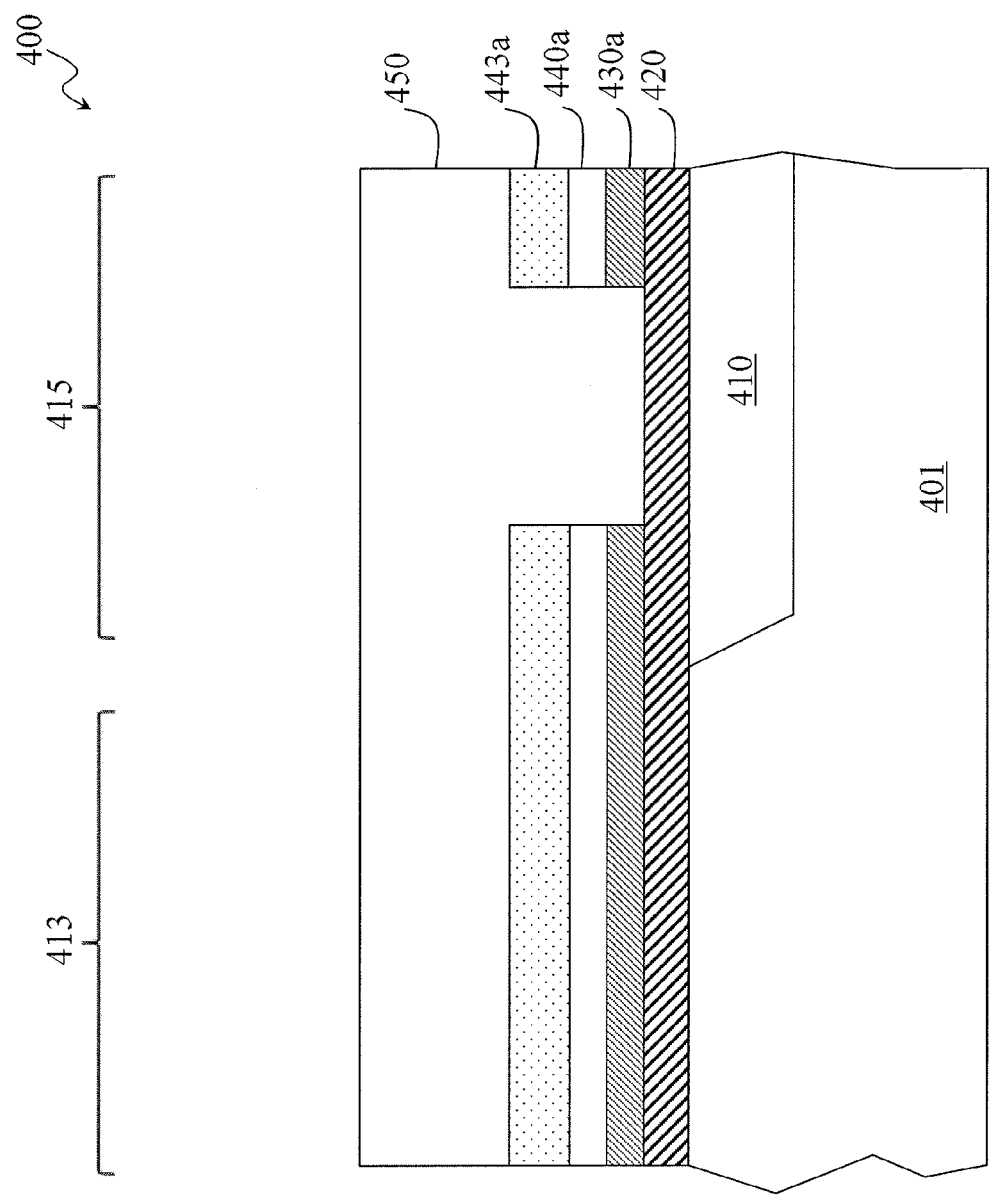

Referring to FIG. 4D, a semiconductor material 450 is formed over the remaining metallic layer 443a and the exposed gate dielectric stack 420. In some embodiments, the semiconductor material 450 continuously extends from the transistor region 413 to the electrical fuse region 415. In other embodiments, the semiconductor material 450 is either undoped or doped.

Figure 4E:
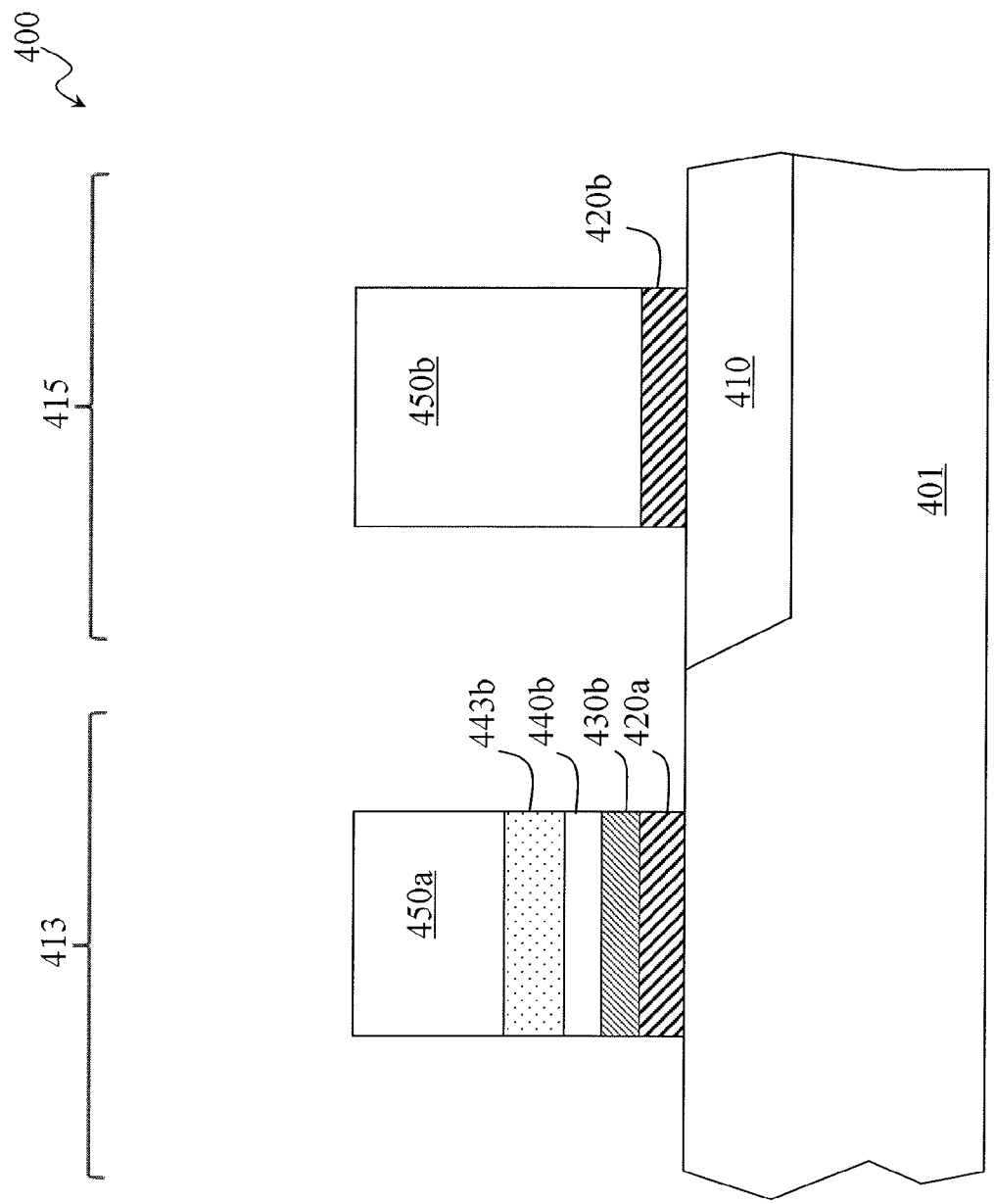

Referring to FIG. 4E, a patterning process is performed to pattern the semiconductor material 450, the remaining metallic layer 443a, the remaining work-function metallic material 440a, the remaining diffusion barrier material 430a and the gate dielectric stack 420 (shown in FIG. 4D). By the patterning process, gate dielectric structures 420a and 420b are formed over the substrate 401 in the transistor region 413 and the electrical fuse region 415, respectively. A diffusion barrier 430b is formed over the gate dielectric structure 420a. A work-function metallic layer 440b is formed over the diffusion barrier 430b. A metallic layer 443b is formed over the work-function metallic layer 440b. Semiconductor layers 450a and 450b are formed over the metallic layer 443b and the gate dielectric structure 420b, respectively.

Figure 4F:
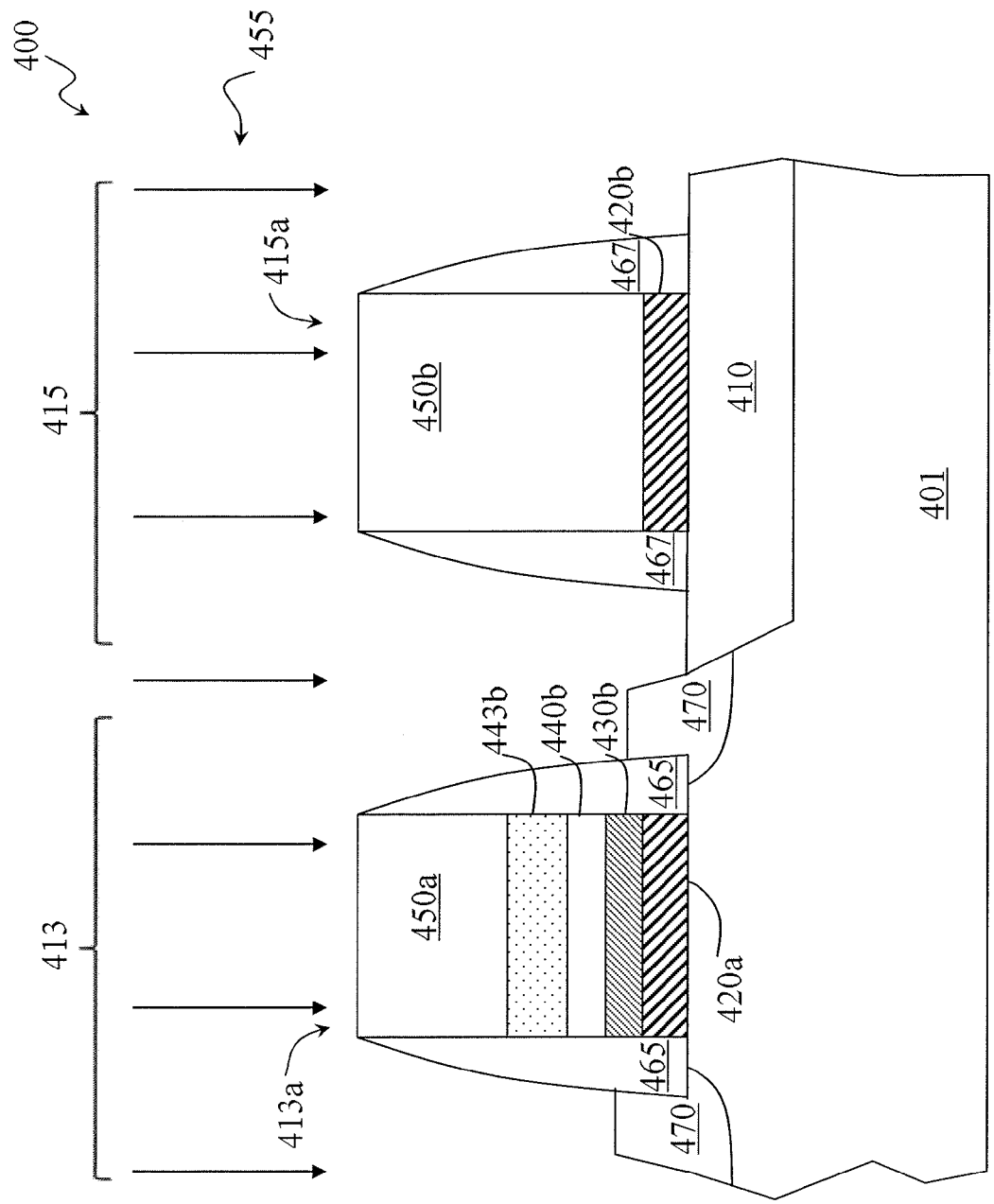

Referring to FIG. 4F, at least one implantation process 455 is performed to implant dopants into the substrate 401 to form a source/drain (S/D) region 470 adjacent to each sidewall of the gate dielectric structure 420a. In some embodiments, semiconductor layer 450b is doped at the same time during the implantation process 455. Spacers 465 and 467 are disposed on sidewalls of the semiconductor layers 450a and 450b, respectively. It is noted that the process of forming the S/D regions 470 optionally includes the processes of forming the LDD regions, the heavily doped regions, and/or stressors described above in conjunction with FIG. 2H.

Figure 4G:
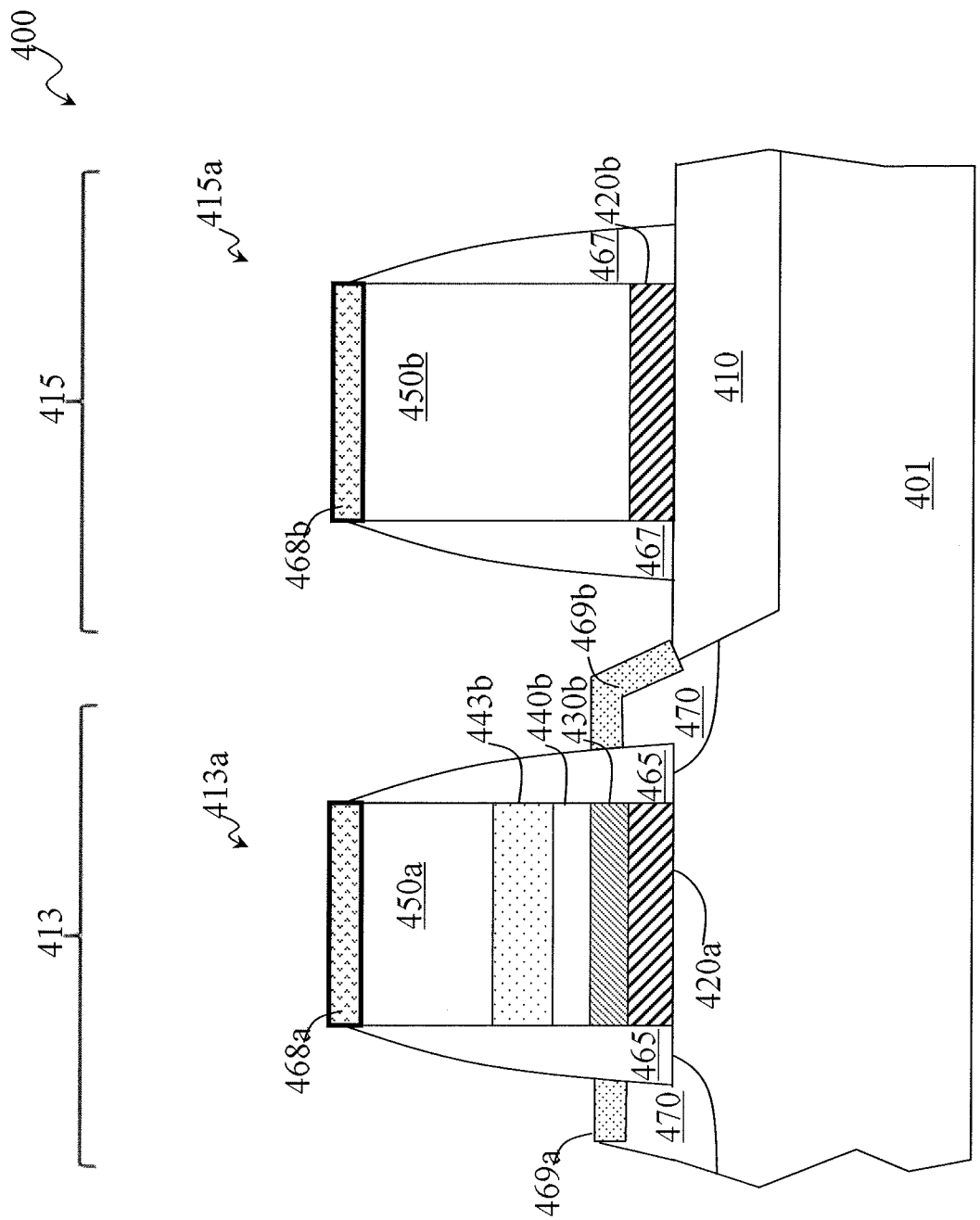

Referring to FIG. 4G, silicide layers 468a-468b and 469a-469b are formed on the respective semiconductor layers 450a, the semiconductor layer 450b, and the S/D regions 470. In the gate-first HK/MG process, the metallic layer 443 is configured to provide electrical connection of the gate electrode of the transistor. Compared with the silicide layer 468a, the metallic layer 443 has a lower resistance, such that a substantive current flows through the metallic layer 443 during the operation of the transistor 413a. Electron migration does not happen to the silicide layer 468a.

In at least one embodiment of this application, a method of forming an integrated circuit includes forming at least one transistor over a substrate. Forming the at least one transistor includes forming a gate dielectric structure over a substrate. A work-function metallic layer is formed over the gate dielectric structure. A conductive layer is formed over the work-function metallic layer. A source/drain (S/D) region is formed adjacent to each sidewall of the gate dielectric structure. At least one electrical fuse is formed over the substrate. Forming the at least one electrical fuse includes forming a first semiconductor layer over the substrate. A first silicide layer is formed on the first semiconductor layer.

In at least another embodiment of this application, an integrated circuit includes at least one transistor and at least one electrical fuse disposed over the substrate. The at least one transistor includes a gate dielectric structure disposed over the substrate. A work-function metallic layer is disposed over the gate dielectric structure. A conductive layer is disposed over the work-function metallic layer. A source/drain (S/D) region is disposed adjacent to each sidewall of the gate dielectric structure. The at least one electrical fuse includes a first semiconductor layer disposed over the substrate and a first silicide layer disposed on the first semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, the method comprising:
    forming at least one transistor over a substrate, wherein forming the at least one transistor comprises:
        forming a gate dielectric structure over a substrate;
        forming a work-function metallic layer over the gate dielectric structure;
        forming a conductive layer over the work-function metallic layer; and
        forming a source/drain (S/D) region being disposed adjacent to each sidewall of the gate dielectric structure;
        forming a diffusion barrier layer between the gate dielectric structure and the work-function layer; and
    forming at least one electrical fuse over the substrate, wherein forming the at least one electrical fuse comprises:
        forming a first semiconductor layer over the substrate; and
        forming a first silicide layer on the first semiconductor layer, wherein the diffusion barrier layer is formed subsequent to the first silicide layer.

2. The method of claim 1, wherein the diffusion barrier is formed around the work-function metallic layer.

3. The method of claim 1, wherein forming the diffusion barrier, forming the work-function metallic layer and forming the conductive layer comprise:
    forming a second semiconductor layer over the gate dielectric structure before forming the first silicide layer;
    forming a second silicide layer on the second semiconductor layer;
    forming a cap layer covering the first silicide layer and exposing the second silicide layer;
    removing the second silicide layer and the second semiconductor layer to form a first opening that is left by the removed second silicide layer and the second semiconductor layer; and
    sequentially forming the diffusion barrier, the work-function metallic layer and the conductive layer in the first opening.

4. The method of claim 1, wherein forming the electrical fuse comprises forming the electrical fuse over a shallow trench isolation (STI) feature in the substrate.

5. The method of claim 4, wherein forming the gate dielectric layer comprises forming the gate dielectric layer over the STI feature.

6. The method of claim 4, wherein forming the S/D region comprises forming the S/D region in contact with the STI feature.

7. The method of claim 1, further comprising protecting the electrical fuse during formation of the diffusion barrier layer.

8. A method of forming an integrated circuit, the method comprising:
    forming a first semiconductor layer in a transistor region over a substrate and a second semiconductor layer in a fuse region over the substrate;
    forming a first silicide layer on the first semiconductor layer and a second silicide layer on the second semiconductor layer;
    forming a dielectric layer around the first and second semiconductor layers, exposing the first and second silicide layers;
    forming a cap layer covering the second silicide layer and exposing the first silicide layer;
    removing the first silicide layer and the first semiconductor layer to form a first opening that is left by the removed first silicide layer and the removed first semiconductor layer;
    sequentially forming a work-function metallic layer and a conductive layer in the first opening; and
    forming a diffusion barrier between the substrate and the work-function metallic layer, wherein the diffusion barrier is formed subsequent to the first silicide layer.

9. The method of claim 8, wherein the diffusion barrier is formed around the work-function metallic layer.

10. The method of claim 8, further comprising forming an electrical fuse over the substrate.

11. The method of claim 10, wherein forming the electrical fuse comprises forming the electrical fuse over a shallow trench isolation (STI) feature in the substrate.

12. The method of claim 11, wherein forming the gate dielectric layer comprises forming the gate dielectric layer over the STI feature.

13. The method of claim 11, wherein forming the S/D region comprises forming the S/D region in contact with the STI feature.

14. A method of forming an integrated circuit, the method comprising:
    forming at least one transistor over a substrate, wherein forming the at least one transistor comprises:
        forming a gate dielectric structure over the substrate;
        forming a work-function metallic layer over the gate dielectric structure;
        forming a conductive layer over the work-function metallic layer, wherein the work-function metallic layer contacts at least one sidewall of the conductive layer; and
        forming a source/drain (S/D) region being disposed adjacent to each sidewall of the gate dielectric structure;
        forming a diffusion barrier layer over the gate dielectric structure, the diffusion barrier layer positioned between the work-function metallic layer and at least one spacer; and
    forming at least one electrical fuse over an isolation structure, the isolation structure formed in the substrate, wherein forming the at least one electrical fuse comprises:
        forming a first semiconductor layer over the substrate;
        forming a first silicide layer on the first semiconductor layer, wherein the diffusion barrier layer is formed subsequent to the first silicide layer; and forming a cap layer over the first silicide layer prior to forming the work-function metallic layer.

15. The method of claim 14, wherein forming the at least one transistor comprises forming at least one spacer over sidewalls of at least one transistor, and forming the work-function metallic layer comprises forming the work-function metallic layer between the conductive layer and the at least one spacer.

16. The method of claim 14, wherein forming the at least one transistor further comprises forming a silicide layer over the gate dielectric structure prior to forming the work-function metallic layer over the gate dielectric structure.

* * * * *